(12) United States Patent
Kim

(10) Patent No.: US 11,289,173 B2
(45) Date of Patent: *Mar. 29, 2022

(54) PROGRAM AND OPERATING METHODS OF NONVOLATILE MEMORY DEVICE

(71) Applicant: Samsung Electronics Co., Ltd., Suwon-si (KR)

(72) Inventor: Boh-Chang Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/004,557

(22) Filed: Aug. 27, 2020

(65) Prior Publication Data

US 2020/0395094 A1   Dec. 17, 2020

Related U.S. Application Data

(63) Continuation of application No. 16/015,929, filed on Jun. 22, 2018, now Pat. No. 10,902,934, which is a
(Continued)

(30) Foreign Application Priority Data

Jan. 13, 2015   (KR) .................. 10-2015-0006034

(51) Int. Cl.
*G11C 29/50*         (2006.01)
*G11C 29/42*         (2006.01)
(Continued)

(52) U.S. Cl.
CPC .... *G11C 29/50004* (2013.01); *G11C 11/5628* (2013.01); *G11C 16/12* (2013.01);
(Continued)

(58) Field of Classification Search
CPC ..... G11C 16/10; G11C 11/5628; G11C 16/12; G11C 13/0069; G11C 2029/5004;
(Continued)

(56) References Cited

U.S. PATENT DOCUMENTS 5,619,224 A     4/1997   Hoshino et al.
7,221,598 B2    5/2007   Jeong
(Continued)

FOREIGN PATENT DOCUMENTS

KR        10-0642439 B1      11/2006
KR     10-2008-0018495 A      2/2008
(Continued)

OTHER PUBLICATIONS

Non-Final Office Action dated Mar. 3, 2021 in U.S. Appl. No. 17/135,125.
(Continued)

*Primary Examiner* — April Y Blair
*Assistant Examiner* — Sazzad Hossain
(74) *Attorney, Agent, or Firm* — Harness, Dickey & Pierce, P.L.C.

(57) ABSTRACT

A program method of a nonvolatile memory device including a plurality of memory cells, each storing at least two bits of data, includes performing a first program operation based on a plurality of program voltages having a first pulse width to program first page data into selected memory cells connected to a selected word line among the plurality of memory cells; and performing a second program operation based on a plurality of program voltages having a second pulse width different from the first pulse width to program second page data into the selected memory cells in which the first page data is programmed.

20 Claims, 18 Drawing Sheets

Related U.S. Application Data continuation of application No. 14/956,659, filed on Dec. 2, 2015, now Pat. No. 10,026,503.

(51) Int. Cl.

| | |
|---|---|
| *G11C 11/56* | (2006.01) |
| *G11C 16/12* | (2006.01) |
| *G11C 29/02* | (2006.01) |
| *G11C 16/10* | (2006.01) |
| *G06F 3/06* | (2006.01) |
| *G06F 11/10* | (2006.01) |
| *G11C 13/00* | (2006.01) |
| *G11C 11/22* | (2006.01) |

(52) U.S. Cl.
CPC .......... *G11C 29/021* (2013.01); *G11C 29/023* (2013.01); *G11C 29/028* (2013.01); *G11C 29/42* (2013.01); *G06F 3/0679* (2013.01); *G06F 3/0688* (2013.01); *G06F 11/1072* (2013.01); *G11C 11/2275* (2013.01); *G11C 13/0069* (2013.01); *G11C 16/10* (2013.01); *G11C 2029/5004* (2013.01)

(58) Field of Classification Search
CPC ................ G11C 11/2275; G06F 3/0679; G06F 11/1072; G06F 12/0246; G06F 3/0688
See application file for complete search history.

(56) References Cited

U.S. PATENT DOCUMENTS

| | | | |
|---|---|---|---|
| 7,230,854 | B2 | 6/2007 | Wan et al. |
| 7,492,634 | B2 | 2/2009 | Li et al. |
| 7,656,710 | B1 | 2/2010 | Wong |
| 7,679,133 | B2 | 3/2010 | Son et al. |
| 8,180,994 | B2 | 5/2012 | Sprouse et al. |
| 8,223,556 | B2 | 7/2012 | Dutta et al. |
| 8,332,578 | B2 | 12/2012 | Frickey, III et al. |
| 8,402,203 | B2 | 3/2013 | Strope |
| 8,553,466 | B2 | 10/2013 | Han et al. |
| 8,559,235 | B2 | 10/2013 | Yoon et al. |
| 8,654,587 | B2 | 2/2014 | Yoon et al. |
| 10,026,503 | B2 * | 7/2018 | Kim .................. G11C 29/028 |
| 10,902,934 | B2 * | 1/2021 | Kim .................... G11C 29/42 |
| 2008/0049497 | A1 | 2/2008 | Mo |
| 2008/0055963 | A1 | 3/2008 | Lee et al. |
| 2008/0232163 | A1 | 9/2008 | Dover |
| 2010/0008145 | A1 | 1/2010 | Wang |
| 2010/0195387 | A1 * | 8/2010 | Park .................. G11C 11/5628 |
| | | | 365/185.03 |
| 2011/0233648 | A1 | 9/2011 | Seol et al. |
| 2012/0239858 | A1 | 9/2012 | Melik-Martirosian |
| 2013/0094292 | A1 * | 4/2013 | Park ...................... G11C 16/10 |
| | | | 365/185.03 |
| 2013/0208543 | A1 | 8/2013 | Park |
| 2013/0223143 | A1 | 8/2013 | Cho et al. |
| 2015/0131373 | A1 | 5/2015 | Alhussien et al. |
| 2015/0262714 | A1 | 9/2015 | Tuers et al. |
| 2016/0093390 | A1 | 3/2016 | Yuan et al. |
| 2021/0118520 | A1 * | 4/2021 | Kim .................... G11C 29/021 |

FOREIGN PATENT DOCUMENTS

| | | |
|---|---|---|
| KR | 10-2010-0088468 A | 8/2010 |
| KR | 10-2010-0111532 A | 10/2010 |
| KR | 10-1080912 B1 | 11/2011 |
| KR | 10-2012-0113553 A | 10/2012 |

OTHER PUBLICATIONS

Notice of Allowance dated Jul. 22, 2021 in U.S. Appl. No. 17/135,125.

* cited by examiner

FIG. 6

| | 1st PGM (LSB) | 2nd PGM (MSB) |
|---|---|---|
| WL6 | ⑩ | ⑫ |
| WL5 | ⑧ | ⑪ |
| WL4 | ⑥ | ⑨ |
| WL3 | ④ | ⑦ |
| WL2 | ② | ⑤ |
| WL1 | ① | ③ |

FIG. 11

| | 1st PGM | 2nd PGM (Coarse) | 3rd PGM (Fine) |
|---|---|---|---|
| WL6 | ⑬ | ⑯ | ⑱ |
| WL5 | ⑩ | ⑭ | ⑰ |
| WL4 | ⑦ | ⑪ | ⑮ |
| WL3 | ④ | ⑧ | ⑫ |
| WL2 | ② | ⑤ | ⑨ |
| WL1 | ① | ③ | ⑥ |

PROGRAM AND OPERATING METHODS OF NONVOLATILE MEMORY DEVICE

CROSS-REFERENCE TO RELATED APPLICATIONS

This US non-provisional patent application application is a continuation of and claims priority under 35 U.S.C. §§ 120/121 to U.S. patent application Ser. No. 16/015,929, filed on Jun. 22, 2018, which is a continuation of and claims priority under 35 U.S.C. §§ 120/121 to U.S. patent application Ser. No. 14/956,659, filed on Dec. 2, 2015, which claims priority under 35 USC § 119 to Korean Patent Application No. 10-2015-0006034, filed on Jan. 13, 2015, the entire contents of each of which are incorporated herein by reference.

BACKGROUND

Semiconductor memory devices are memory devices implemented using a semiconductor such as silicon (Si), germanium (Ge), gallium arsenide (GaAs), and indium phosphide (InP). In general, semiconductor memory devices are classified into volatile memory devices and nonvolatile memory devices.

Volatile memory devices lose their stored data when their power supplies are interrupted. Volatile memory devices may include, for example, a static RAM (SRAM), a dynamic RAM (DRAM), and a synchronous DRAM (SDRAM). Nonvolatile memory devices are memory devices that retain their stored data even when their power supplies are interrupted. Nonvolatile memory devices may include, for example, a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (ReRAM), and a ferroelectric RAM (FRAM).

Since nonvolatile memory devices retain their stored data even when their power supplies are interrupted, nonvolatile memory devices may be used as a mass storage medium. A flash memory stores data by changing threshold voltages of memory cells. With the recent advance in semiconductor technology, a multi-level cell (MLC) adapted to store at least two bits of data in a single memory cell has been widely used. However, since an MLC is adapted to a plurality of bits in a single memory cell, the MLC has less read margin. As sizes of memory cells are decreasing with the recent advance in semiconductor integration technology, data stored in MLCs may be lost due to external factors or interference between adjacent memory cells. Accordingly, various program schemes for programming MLCs have been developed to address the above disadvantages.

SUMMARY

The present disclosure relates to semiconductor memories and, more particularly, to a nonvolatile memory device, an operating method of the same, and a programming method of the same.

According to at least one example embodiment of the inventive concepts, a program method of a nonvolatile memory device including a plurality of memory cells, each storing at least two bits of data, includes performing a first program operation based on a plurality of program voltages having a first pulse width to program first page data into selected memory cells connected to a selected word line among the plurality of memory cells; and performing a second program operation based on a plurality of program voltages having a second pulse width different from the first pulse width to program second page data into the selected memory cells in which the first page data is programmed.

The first pulse width may be narrower than the second pulse width.

Each of the first and second program operations may include a plurality of program loops.

Each of the plurality of program loops included in the first program operation may include a program step of applying a program voltage having the first pulse width; and a verify step of applying at least one verify voltage corresponding to the first page data.

Each of the program loops included in the second program operation may include a program step of applying a program voltage having the second pulse width; and a verify step of applying at least two verify voltages corresponding to the first page data and the second page data.

The program method may further include generating the program voltages having the first pulse width such that the program voltages having the first pulse width include, a first rising period which includes rising from a low voltage level to a program voltage level; a first execution period which includes maintaining the program voltage level; and a first recovery period which includes dropping from the program voltage level to the low voltage level.

The program method may further include generating the program voltages having the second pulse width such that the program voltages having the second pulse width include, a second rising period which includes rising from a low voltage level to a program voltage level; a second execution period which includes maintaining the program voltage level; and a second recovery period which includes dropping from the program voltage level to the low voltage level.

The program voltages having the second pulse width and the program voltages having the first pulse width may be generated such that, the first rising period is shorter than the second rising period, the first execution period is shorter than the second execution period, or the first recovery period is shorter than the second recovery period.

Performing the second program operation may include performing the second program operation after the first program operation is performed.

The nonvolatile memory device may include a three-dimensional memory array.

The three-dimensional memory array may be monolithically formed in one or more physical levels of arrays of memory cells having an active area disposed above a silicon substrate.

The three-dimensional memory array may include a plurality of memory cells each including a charge trap layer.

According to at least one example embodiment of the inventive concepts, an operating method of a nonvolatile memory device including a plurality of memory cells each storing at least two bits of data and programming the plurality of memory cells based on a multi-step program scheme including a plurality of program operations, incudes receiving a command and data from an external device; determining a type of a program operation to be performed in response to the command among the plurality of program operations; adjusting a program parameter including pulse width of a program voltage according to a result of the determination; and programming the data into selected memory cells connected to a selected word line among the plurality of memory cells based on the adjusted program parameter.

The determining the type of program operation to be performed may include reading a flag bit corresponding to the selected word line; and determining the type of program operation to be performed, based on the read flag bit.

The determining the type of program operation to be performed may include determining the type of program operation to be performed, based on a number of program operations performed on the selected memory cells.

According to at least some example embodiments, a method may include receiving, at a non-volatile memory device, a command to perform a first program operation, the first programming operation being associated with a first number of threshold voltage states such that the first programming operation includes programming threshold voltages of a plurality of multi-level cells (MLCs) of the non-volatile memory device to be within one of the first number of threshold voltage states; and executing the first program operation by applying a first plurality of program voltage pulses to a plurality of multi-level cells (MLCs) of non-volatile memory device such that the first plurality of program voltage pulses each have a first pulse width, the first pulse width being set such that a length of the first pulse width increases as the number of threshold voltage states associated with the first programming operation increases.

The method may include determining a type of the first programming operation; and setting the length of the first pulse width based on the determined type.

The setting the length of the first pulse width may include setting the length of the first pulse width to be a first length when the type of the first program operation is a type for programming the threshold voltages of the plurality of MLCs to be within one of only two threshold voltage states, and setting the length of the first pulse width to be a first length when the type of the first program operation is a type for programming the threshold voltages of the plurality of MLCs to be within one of only a first number of threshold voltage states, the first number being greater than two, the first length being shorter than the second length.

The setting the length of the first pulse width may include setting the length of the first pulse width to be a first length when the type of the first program operation is a type for programming least significant bit (LSB) page data into the plurality of MLCs, and setting the length of the first pulse width to be a first length when the type of the first program operation is a type for programming most significant bit (MSB) page data into the plurality of MLCs, the first length being shorter than the second length.

The first programming operation may be an incremental step pulse programming (ISPP) operation.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 6 is drawing for describing a program sequence of the nonvolatile memory device in FIG. 1.

FIGS. 9 to 11 are drawings for describing an operation of a nonvolatile memory device according to at least some example embodiments of the inventive concepts.

DETAILED DESCRIPTION

Figure 1:
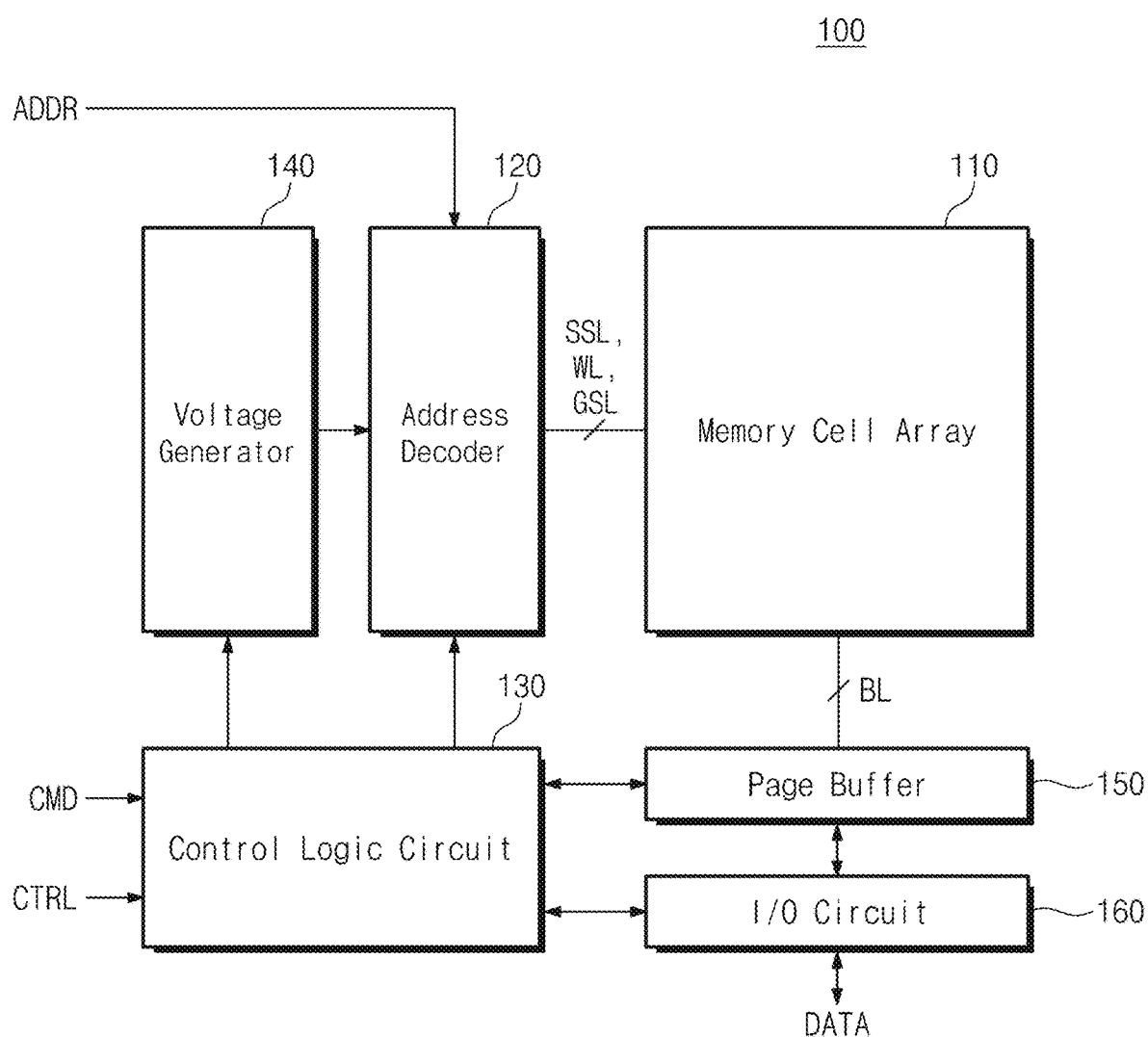
FIG. 1 is a block diagram of a nonvolatile memory according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A nonvolatile memory device according to at least some example embodiments of the inventive concepts may program multi-level cells based on a multi-step program scheme. The multi-step program scheme includes a plurality of program operations. The nonvolatile memory device may adjust pulse width of a program voltage according to a program operation to be performed. Thus, a nonvolatile memory device with improved performance may be provided.

FIG. 1 is a block diagram of a nonvolatile memory 100 according to at least some example embodiments of the inventive concepts. As illustrated, the nonvolatile memory device 100 includes a memory cell array 110, an address decoder 120, a control logic circuit 130, a voltage generator 140, a page buffer 150, and an input/output (I/O) circuit 160.

The memory cell array 110 may include a plurality of memory blocks. Each of the memory blocks may include a plurality of cell strings. Each of the cell strings may include a plurality of memory cells. The plurality of memory cells may be connected to a plurality of word lines WL, respectively. Each of the memory cells may be provided as a single-level cell (SLC) storing one bit of data or a multi-level cell (MLC) storing at least two bits of data.

The address decoder 120 may be connected to the memory cell array 110 through a plurality of word lines WL, string selection lines SSL, and ground selection lines GSL. The address decoder 120 may receive an address ADDR from an external device (e.g., a memory controller, a host, an application processor, etc.) and decode the received address ADDR to drive a plurality of word lines. For example, the address decoder 120 may decode the address ADDR received from the external device and select at least one of the word lines WL based on the decoded address ADDR. The address decoder 120 may provide a voltage received from the voltage generator 140 (more specifically, a word line voltage) to the selected word line.

The control logic circuit 130 may receive a command CMD and a control signal CTRL from the external device and control the address decoder 120, the voltage generator 140, the page buffer 150, and the I/O circuit 160 in response to received signals. For example, the control logic circuit 130 may control other components to store data DATA in the memory cell array 110 in response to the received signals CMD and CTRL. Alternatively, the control logic circuit 130 may control other components to transmit data DATA stored in the memory cell array 110 to the external device in response to the received signals CMD and CTRL. According to at least some example embodiments of the inventive concepts, the control logic circuit 130 may be embodied by one or more processors. According to at least some example embodiments of the inventive concepts, operations described herein as being performed by the nonvolatile memory 100 may be performed by, or under the control of, the control logic circuit 130.

The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multiprocessor, an application-specific integrated circuit (ASIC), and a field programmable gate array (FPGA).

The voltage generator 140 may generate various voltages required to operate the nonvolatile memory device 100. For example, the voltage generator 140 may generate various voltages such as a plurality of program voltages, a plurality of pass voltages, a plurality of selected read voltages, a plurality of unselected read voltages, a plurality of erase voltages, a plurality of verify voltages, and so on. According to at least some example embodiments of the inventive concepts, the voltage generator 140 may generate a plurality of program voltages under the control of the control logic circuit 130. According to at least some example embodiments of the inventive concepts, the voltage generator 140 may adjust pulse width of a plurality of program voltages under the control of the control logic circuit 130. According to at least some example embodiments of the inventive concepts, the voltage generator 140 may be implemented by, for example, a circuit or circuitry.

The page buffer 150 is connected to the memory cell array 110 through a plurality of bitlines BL. The page buffer 150 may control the bitlines BL based on the data DATA received from the I/O circuit 160 under the control of the control logic circuit 130. The page buffer 150 may read data stored in the memory cell array 110 and transmit the read data to the I/O circuit 160 under the control of the control logic circuit 130. According to at least some example embodiments of the inventive concepts, the page buffer 150 may receive data from the I/O circuit 160 by a unit of page or read data from the memory cell array by a unit of page.

The I/O circuit 160 may receive data DATA from an external device and transmit the received data DATA to the page buffer 150. Alternatively, the I/O circuit 160 may receive data DATA from the page buffer 150 and transmit the received data DATA to the external device. According to at least some example embodiments of the inventive concepts, the I/O circuit 160 may transmit or receive data DATA to or from the external device in synchronization with the control signal CTRL.

According to at least some example embodiments of the inventive concepts, the nonvolatile memory device 100 may include a three-dimensional (3D) memory array. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

According to at least one example embodiment of the inventive concepts, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bitlines shared between levels: U.S. Pat. Nos. 7,679,133; 8,553,466; 8,654,587; 8,559,235; and US Pat. Pub. No. 2011/0233648.

According to at least some example embodiments of the inventive concepts, each of the memory cells included in the nonvolatile memory device 100 may be a multi-level cell (MLC) storing at least two bits of data. The nonvolatile memory device 100 may program data DATA into multi-level cells based on a multi-step program scheme. The multi-step program scheme indicates a program scheme in which at least two program operations are performed to program a plurality of page data into memory cells connected to a single word line. Each of the at least two program operations includes a plurality of program loops. According to at least some example embodiments of the inventive concepts, the multi-step program scheme may include various program schemes such as a shadow program scheme, a reprogram scheme, and etc.

For example, when a plurality of memory cells included in the nonvolatile memory device 100 are multi-level cells storing two bits of data, a first program operation and a second program operation may be performed to program data DATA. During the first program operation, the nonvolatile memory device 100 may program LSB page data corresponding to a last significant bit (LSB), among page data to be stored, into selected memory cells connected to a selected word line. Then, during the second program operation, the nonvolatile memory device 100 may program MSB page data corresponding to a most significant bit (MSB), among the page data to be stored, into the selected memory cells connected to the selected word line (i.e., memory cells into which the LSB page data is programmed).

According to at least some example embodiments of the inventive concepts, the nonvolatile memory device 100 may adjust a program voltage applied to a selected word line according to a plurality of program operations for use in the multi-step program scheme. More specifically, the nonvolatile memory device 100 may adjust pulse width of a program voltage applied to a selected word line according to a plurality of program operations for use in the multi-step program scheme. For example, the nonvolatile memory device 100 may perform the first program operation based on program voltages having a first pulse width. The nonvolatile memory device 100 may perform the second program operation based on program voltages having a second pulse width different from the first pulse width.

Figure 2:
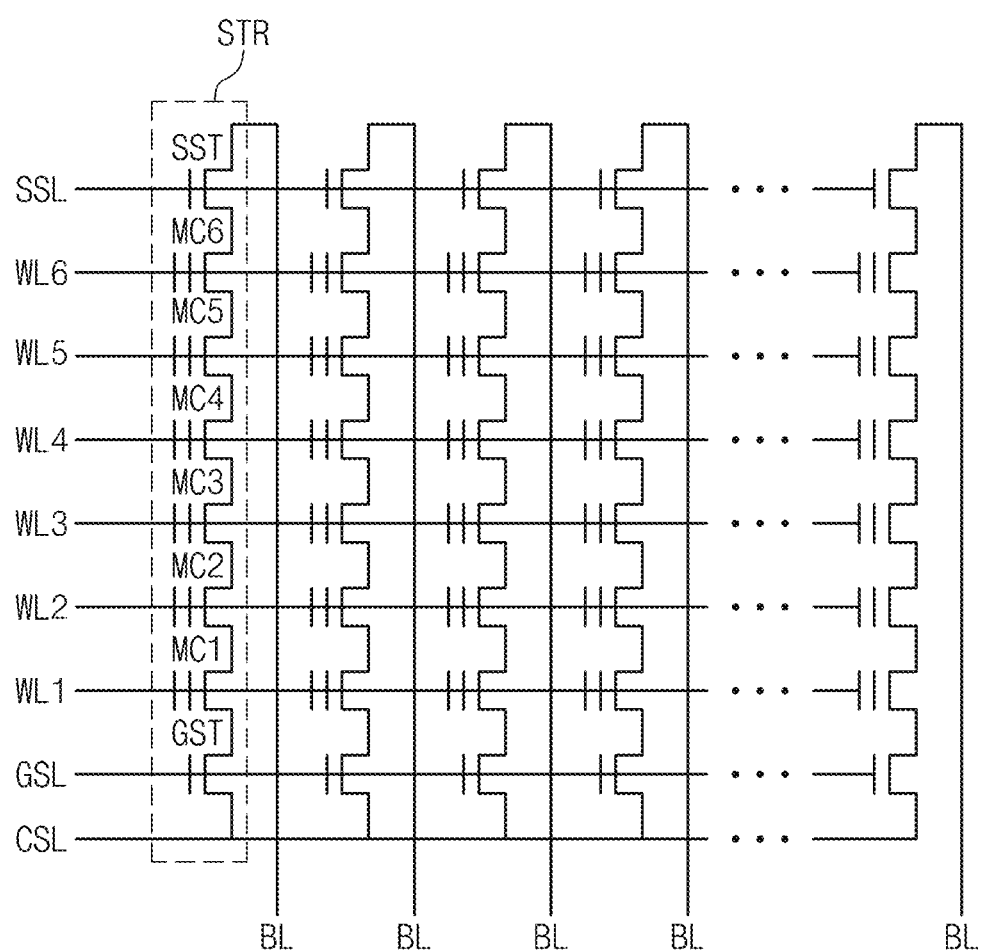
FIG. 2 is a circuit diagram of a first memory block among a plurality of memory blocks included in a memory cell array in FIG. 1.

FIG. 2 is a circuit diagram of a first memory block BLK1 among a plurality of memory blocks included in a memory cell array in FIG. 1. Although the first memory block BLK1 will be described with reference to FIG. 2, at least some example embodiments of the inventive concepts are not limited thereto. Referring to FIGS. 1 and 2, the first memory block BLK1 includes a plurality of cell strings STR. Each of the cell strings STR includes a string selection transistor SST, first to sixth memory cells MC1 to MC6, and a ground selection transistor GST. The string selection transistors SST are connected to a string selection line SSL. The first to sixth memory cells MC1 to MC6 are connected to first to sixth word lines WL1 to WL6, respectively. The ground selection transistors GST is connected to a ground selection line GSL. A plurality of cell strings STR are connected to a plurality of bitlines BL, respectively.

Figure 3:
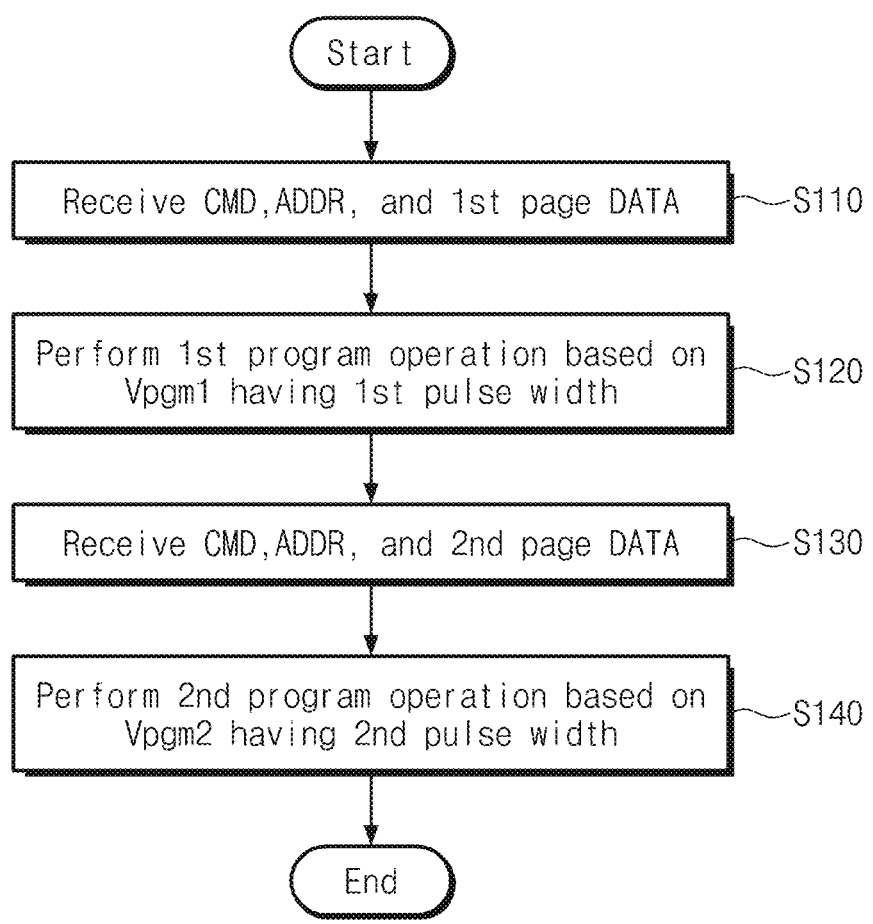
FIG. 3 is a flowchart summarizing a program operation of the nonvolatile memory device in FIG. 1.

FIG. 3 is a flowchart summarizing a program operation of the nonvolatile memory device 100 in FIG. 1. It will be assumed that the nonvolatile memory device 100 performs a program operation based on a multi-step program scheme. However, at least some example embodiments of the inventive concepts are not limited thereto.

In addition, for brevity of description, it will be assumed that a plurality of memory cells MC1 to MC6 are multi-level cells, each storing two bits of data and memory cells connected to a selected word line store first page data (e.g., LSB page data) and second page data (e.g., MSB page data).

In addition, it will be assumed that the nonvolatile memory device 100 programs first page data and second page data into selected memory cells connected to a selected word line based on a multi-step program scheme including first and second program operations. However, at least some example embodiments of the inventive concepts are not limited thereto and a plurality of memory cells MC1 to MC6 may include an SLC storing one bit of data or an MLC storing at least two bits of data. The multi-step program scheme may further include a plurality of program operations.

Referring to FIGS. 1 and 3, in an operation S110, the nonvolatile memory device 100 may receive a command CMD, an address ADDR, and first page data from an external device (e.g., a memory controller, a host, an application, etc.). According to at least some example embodiments of the inventive concepts, the command CMD may be a program command defined by an interface between the nonvolatile memory device 100 and the external device. The address ADDR may be a physical address corresponding to a selected word line. The first page data may be LSB page data among a plurality of page data to be written into selected memory cells connected to a selected word line.

In an operation S120, the nonvolatile device 100 may perform a first program operation based on program voltages having a first pulse width. For example, the nonvolatile memory device 100 performs the first program operation to write the first page data into memory cells connected to a selected word line corresponding to the address ADDR. The first program operation may be performed based on an incremental step pulse programming (hereinafter referred to as "ISPP") scheme. That is, the first program operation may include a plurality of program loops. Each of the program loops includes a program step of applying a program voltage to a selected word line and a verify step of applying a verify voltage to the selected word line. As the program loops are performed, the program voltage increases sequentially. The nonvolatile memory device 100 may adjust a pulse width of program voltages applied in each program step of the program loops included in the first program operation into a first pulse width. In other words, the nonvolatile memory device 100 may apply a program voltage having the first pulse width to the selected word line during the first program operation.

After the first program operation is completed (i.e., the first page data is programmed into the selected memory cells), in an operation S130, the nonvolatile memory device 100 receives a command CMD, an address ADDR, and second page data from the external device. According to at least some example embodiments of the inventive concepts, the command CMD received at the operation S130 may be a program command for programming a second page data. According to at least some example embodiments of the inventive concepts, the address ADDR may be identical to the address ADDR in the operation S110. According to at least some example embodiments of the inventive concepts, the command CMD and the address ADDR may be omitted in the operation S130.

In an operation S140, the nonvolatile memory device 100 may perform a second program operation based on program voltages having a second pulse width. For example, the nonvolatile memory device 100 may perform the second program operation to write the second page data into memory cells connected to a selected word line corresponding to the address ADDR (i.e., the selected memory cells into which the first page data is programmed). The second program operation may be performed based on the ISPP scheme. That is, the second program operation may include a plurality of program loops. Each of the program loops includes a program step of applying a program voltage to a selected word line and a verify step of applying a verify voltage to the selected word line. As the program loops are performed, the program voltage increases sequentially. The nonvolatile memory device 100 may adjust a pulse width of program voltages applied in each program step of the program loops included in the second program operation into a second pulse width. In other words, the nonvolatile memory device 100 may apply a program voltage having the second pulse width to the selected word line during the second program operation.

According to at least some example embodiments of the inventive concepts, the second pulse width is different from the first pulse width. More specifically, the second pulse width may be a greater width than the first pulse width. That is, the nonvolatile memory device 100 may adjust a pulse width of a program voltage according to a program operation to be performed. That is, according to at least some example embodiments of the inventive concepts, the pulse width of the program voltage varies depending on a program operation to provide a nonvolatile memory device with improved performance.

Figure 4:
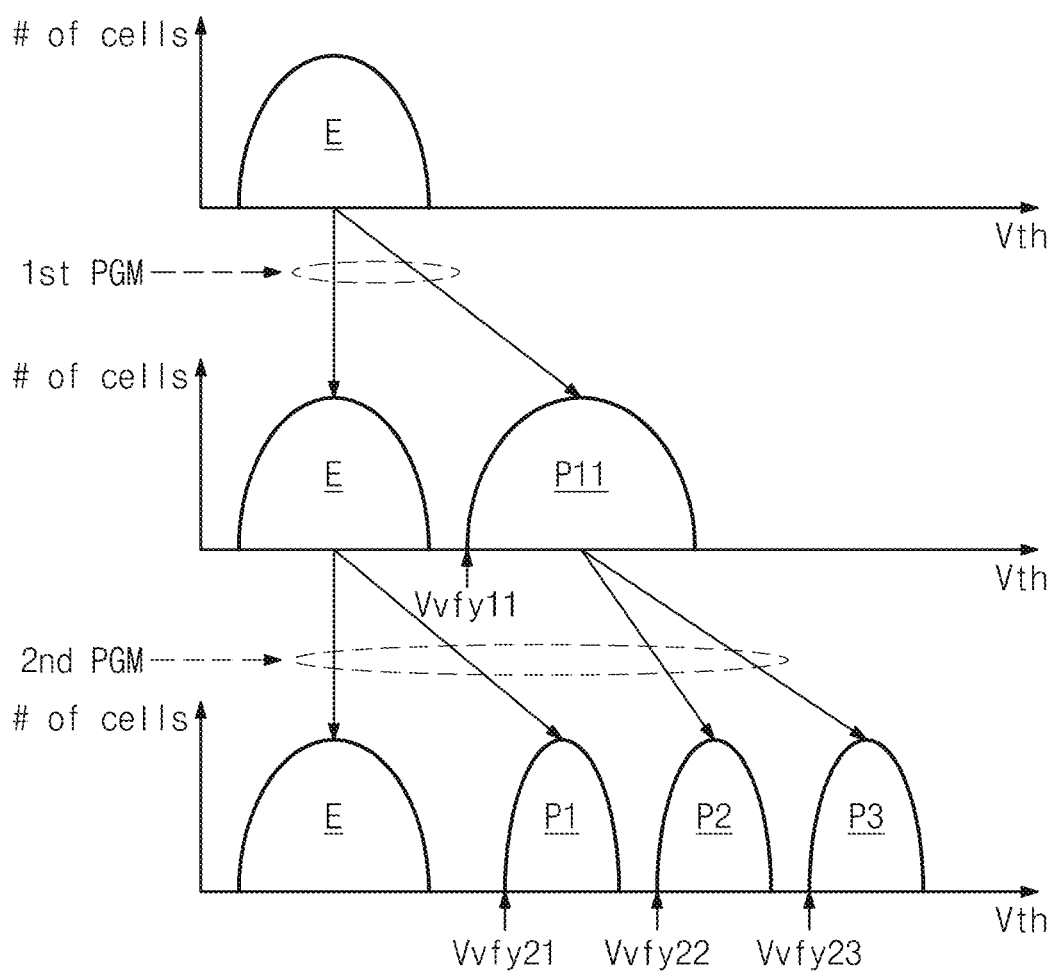
FIGS. 4 and 5 illustrate the operation of the nonvolatile memory in FIG. 3.
Figure 5:
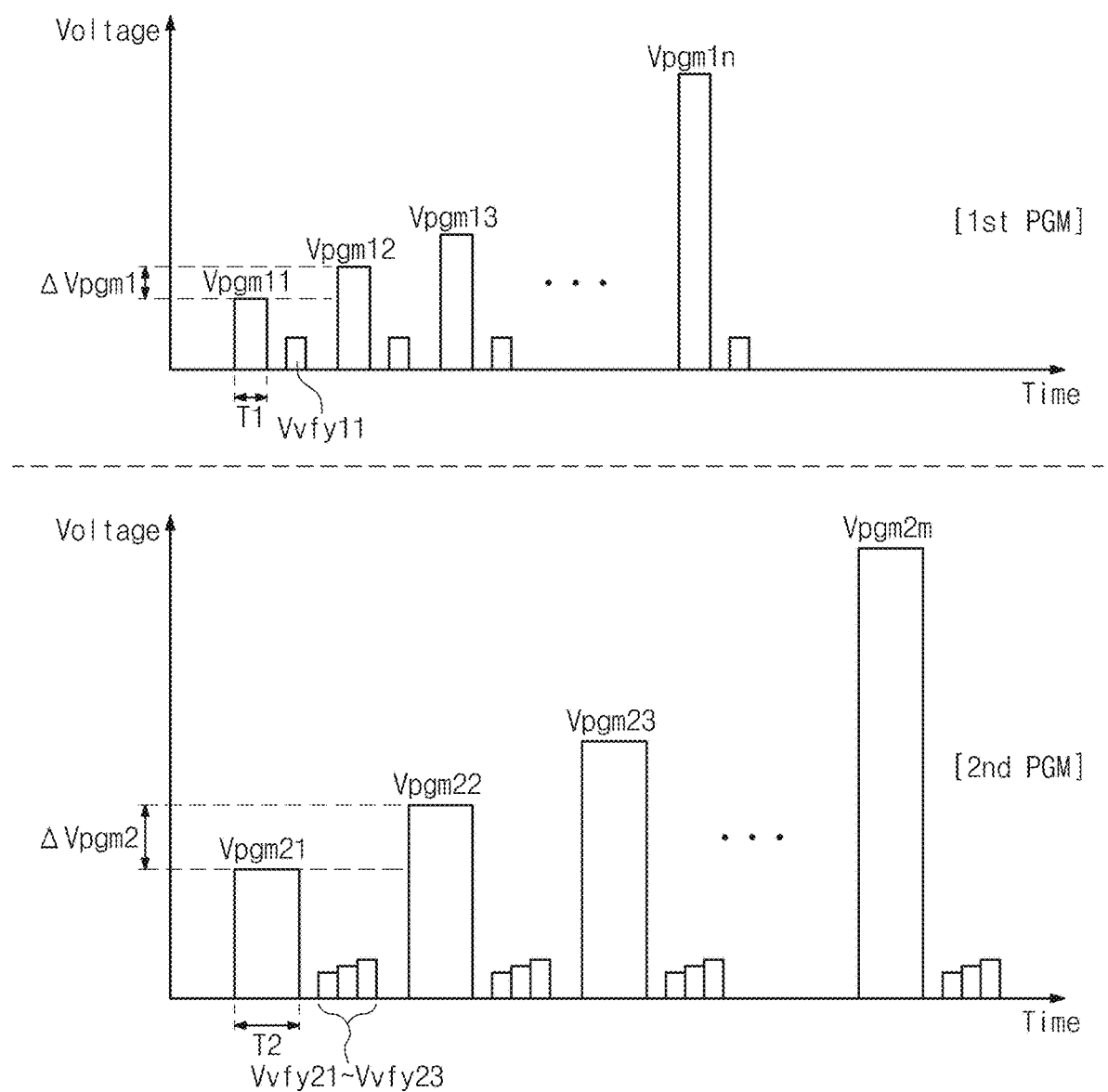

FIGS. 4 and 5 illustrate the operation in FIG. 3. According to at least some example embodiments of the inventive concepts, FIG. 4 is drawing showing threshold voltage distributions of memory cells according to each program operation and FIG. 5 is a graph to show a program voltage and a verify voltage applied to a selected word line according to a program operation.

Referring to FIG. 1 and FIGS. 3 to 5, selected memory cells connected to a selected word line may have an erase state E. At this point, the nonvolatile memory device 100 may receive a command CMD, an address ADDR, and first page data from an external device, as described in the operation S110 in FIG. 3. According to at least some example embodiments of the inventive concepts, the command CMD may be a program command and the address ADDR may be a physical address corresponding to a selected word line.

The nonvolatile memory device 100 may perform a first program operation such that each of the memory cells connected to a selected word line has one of the erase state E and a program state P11. For example, the nonvolatile memory device 100 may perform the first program operation based on the ISPP scheme, as shown in FIG. 5. More specifically, according to at least some example embodiments of the inventive concepts, the first program operation includes a plurality of program loops. Each of the program loops includes a program step of applying program voltages Vpgm11 to Vpgm1$n$ and a verify step of applying a verify voltage Vvfy11. According to at least some example embodiments of the inventive concepts, as the program loops in the first program operation are performed, the nonvolatile memory device 100 may sequentially increase the program voltages by a first increment of program voltage $\Delta$Vpgm1. During the first program operation, the nonvolatile memory device 100 may adjust pulse width of the program voltages Vpgm11 to Vpgm1$n$ into first time T1.

After performing the first program operation to program the first page data into all the memory cells connected to the selected word line, the nonvolatile memory device 100 may receive a command CMD, an address ADDR, and data DATA from an external device. According to at least some example embodiments of the inventive concepts, the nonvolatile memory device may perform the second program operation without the command CMD or the address ADDR.

The nonvolatile memory device 100 may perform a second program operation to program second page data into the memory cells connected to the selected word line (i.e., memory cells into which the first page data is written or memory cells having one of the erase state E and a program state P11). According to at least some example embodiments of the inventive concepts, the nonvolatile memory device

100 may perform the second program operation such that the memory cells connected to the selected word line (i.e., memory cell into which the first page data is written or memory cells having one of the erase state E and the program state P11) has one of the erase state E and program states P21, P22, and P23.

For example, the nonvolatile memory device 100 may perform the second program operation based on the ISPP scheme, as shown in FIG. 5. More specifically, according to at least some example embodiments of the inventive concepts, the second program operation includes a plurality of program loops. Each of the program loops includes a program step of applying program voltages Vpgm21 to Vpgm2*m* and a verify step of applying verify voltages Vvfy21 to Vvfy32, as the program loops in the first program operation are performed, the nonvolatile memory device 100 may sequentially increase the program voltages by a second incremental of program voltage ΔVpgm2. The nonvolatile memory device 100 may adjust a pulse width of the program voltages Vpgm21 to Vpgm2*m* into second time T2. According to at least some example embodiments of the inventive concepts, the second time T2 may be longer than the first time T1.

According to at least some example embodiments of the inventive concepts, the verify voltage Vvfy21 to Vvfy23 of the second program operation may be verify voltages for verifying program states (i.e., first to third program state P1 to P3) corresponding to first and second page data.

As described above, the nonvolatile memory device 100 may perform a multi-step program. For example, the nonvolatile memory device 100 may adjust pulse width of a program voltage according to a program operation to be performed.

FIG. 6 is drawing for describing a program sequence of the nonvolatile memory device in FIG. 1. According to at least some example embodiments of the inventive concepts, a multi-program scheme described with reference to FIG. 6 is merely an example, and at least some example embodiments of the inventive concepts are not limited thereto. Referring to FIGS. 1 and 6, each of memory cells included in the nonvolatile memory device 100 may be an MLC storing two bits of data and the nonvolatile memory device 100 may perform a program operation based on a multi-step program scheme including first and second program operations.

The nonvolatile memory device 100 may perform the first and second program operations on memory cells according to the sequence shown in FIG. 6. For example, the nonvolatile memory device 100 performs the first program operation on memory cells connected to a first word line WL1. (①) Then the nonvolatile memory device 100 performs the first program operation on memory cells connected to a second word line WL2. (②) Then, the nonvolatile memory device 100 performs the second program operation on the memory cells connected to the first word line WL1. (③) Similarly, the nonvolatile memory device 100 may perform the first and second program operations on memory cells connected to the other word lines WL2 to WL6 according to the sequence in FIG. 6. (④-⑫)

According to at least some example embodiments of the inventive concepts, the first program operation may indicate an operation to program first page data (e.g., LSB page data) and the second program operation may indicate an operation to program second page data (e.g., MSB page data).

According to at least some example embodiments of the inventive concepts, the nonvolatile memory device 100 may determine whether a program operation to be performed is the first program operation or the second program operation based on a flag bit. According to at least some example embodiments of the inventive concepts, after completing the first program operation, the nonvolatile memory device 100 may write a flag bit indicating the completion of the first program operation into at least one of the memory cells connected to a selected word line or a spare area corresponding to the selected word line. Then when receiving a program command CMD for the selected word line, the nonvolatile memory device 100 may read the flag bit written into the at least one of the memory cells connected to the selected word line to determine a program operation to be performed. Alternatively, the nonvolatile memory device 100 may receive information on a program operation to be performed from an external device and determine the program operation to be performed, based on the received information.

Figure 7:
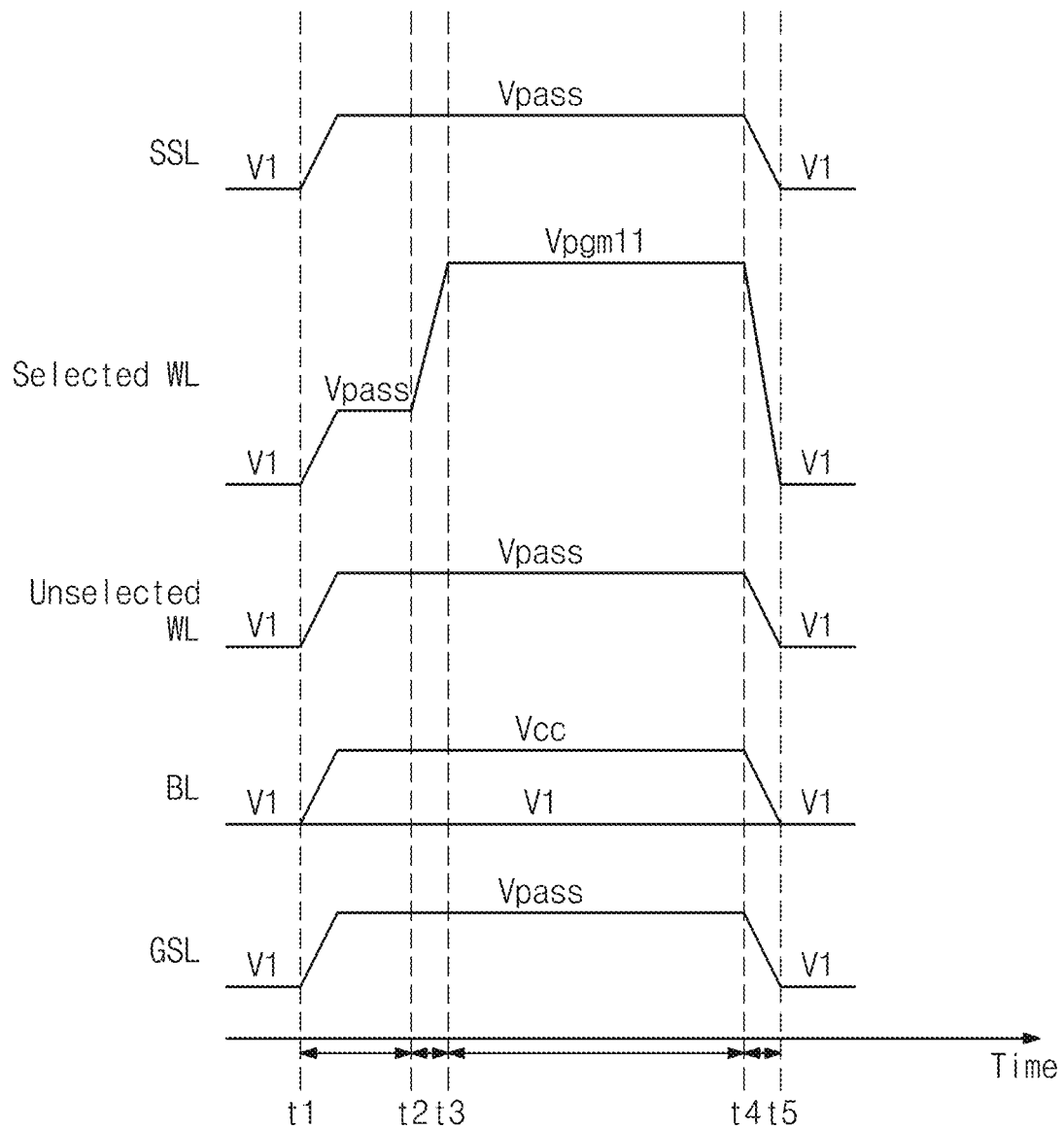
FIGS. 7 and 8 are timing diagrams showing bias voltage in first and second program operations.
Figure 8:
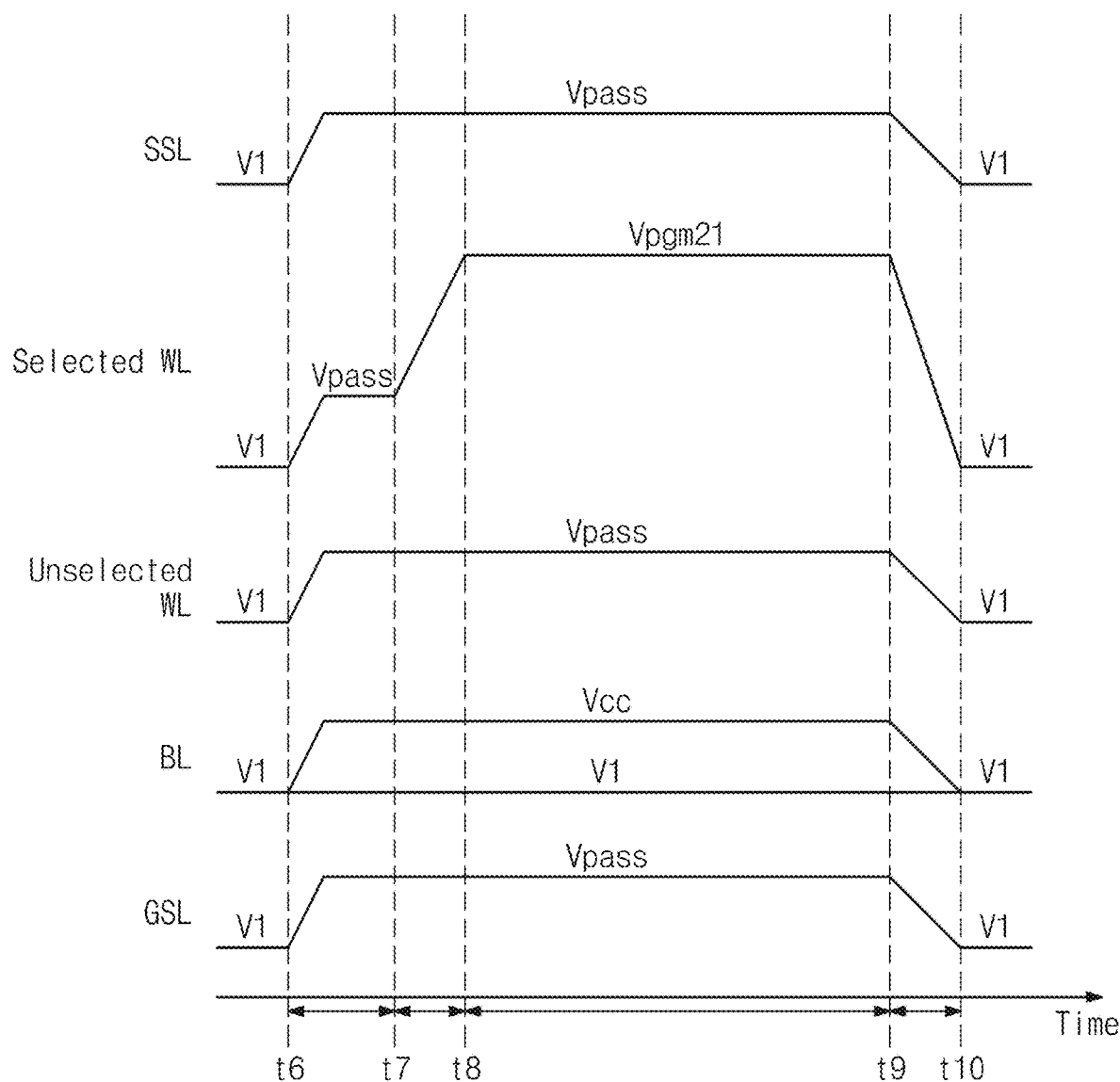

FIGS. 7 and 8 are timing diagrams showing bias voltage in first and second program operations. For brevity of description and drawings, a program voltage applied in one of a plurality of program loops is shown in FIGS. 7 and 8. Thus, a program step in one of a plurality of program loops is described, respectively. According to at least some example embodiments of the inventive concepts, FIG. 7 shows a program voltage Vpgm11 of a first program operation, and FIG. 8 shows a program operation Vpgm21 of a second program operation. In FIGS. 7 and 8, the X-axis represents time and the Y-axis represents a voltage level.

Referring to FIGS. 1, 2, 5, and 7, the nonvolatile memory device 100 may apply bias voltages such as shown in FIG. 7 to a string selection line SSL, a selected word line WL, unselected word lines WL, a bitline BL, and a ground selection line GSL in a program step included in a single program loop of the first program operation.

For example, at a first time point t1, voltages of the string selection line SSL, the selected word line, the unselected word line, and the ground selection line GSL may start rise from a first voltage to a pass voltage Vpass or a power supply voltage Vcc. According to at least some example embodiments of the inventive concepts, the first voltage V1 may be a low voltage or a ground voltage Vss. The pass voltage Vpass may be a high voltage capable of turning on memory cells, the string selection transistor SST, and the ground selection transistor GST.

According to at least some example embodiments of the inventive concepts, a voltage of a bitline BL corresponding to program-inhibited memory cells starts to be charged to a power supply voltage Vcc at the first time point t1.

At a second time point t2, the voltage of the selected word line WL starts rise to the program voltage Vpgm11. From a third time point t3 to a fourth time point t4, the voltage of the selected word line WL may be maintained at the program voltage Vpgm11. From the fourth time point t4 to a fourth time point t5, the voltages of the string selection line SSL, the selected word line WL, the unselected word line WL, the bitline BL, and the ground selection line GSL may drop to the first voltage V1.

Continuing to refer to FIGS. 1, 2, 5, and 7, the nonvolatile memory device 100 may apply bias voltage such as shown in FIG. 8 to the string selection line SSL, the selected word line WL, the unselected word lines WL, the bitline BL, and the ground selection line GSL in a program step included in a single program loop of the second program operation.

For example, at a sixth time point t6, the voltages of the string selection line SSL, the selected word line WL, the unselected word line WL, and the ground selection line GSL may start rise from a first voltage V1 to a pass voltage Vpass or a power supply voltage Vcc. According to at least some example embodiments of the inventive concepts, the first voltage V1 may be, for example, a low voltage or a ground voltage Vss. The pass voltage may be a high voltage capable of turning on memory cell, the string selection transistor SST, and the ground selection transistor GST. According to at least some example embodiments of the inventive concepts, a voltage of a bitline BL corresponding to program-inhibited memory cells is charged to the power supply voltage Vcc at the sixth time point t5.

At a seventh time point t7, the voltage of the selected word line WL starts rise to the program voltage Vpgm21. From an eighth time point t8 to a ninth time point t9, the voltage of the selected word line may be maintained at the program voltage Vpgm21. From the ninth time point t9 to a tenth time point t10, the voltage of the string selection line SSL, the selected word line WL, the unselected word lines WL, the bitline BL, and the ground selection line GSL may drop to the first voltage V1.

According to at least some example embodiments of the inventive concepts, a period of the program step of the first program operation shown in FIG. 7 (i.e., a period from the first time point t1 to the fifth time point t5) may be shorter than a period of the program step of the second program operation shown in FIG. 8 (i.e., a period from the sixth time point t6 to the tenth time point t10). That is, the nonvolatile memory device 100 may adjust pulse width of a program voltage according to a program operation to be performed, as described with reference to FIG. 5.

According to at least some example embodiments of the inventive concepts, a program pulse width may include a rising period, an execution period, and a recovery period. The rising period indicates a period in which a voltage applied to a selected word line rises from the first voltage V1 or the pass voltage Vpass to a program voltage Vpgm. For example, the rising period may indicate a time period from the first time point t1 to the third time point t3 in FIG. 7 and a time period from the sixth time point t6 to the eighth time point t8 in FIG. 8. Alternatively, the rising period may indicate a time period from the second time point t2 to the third time point t3 in FIG. 7 and a time period from the seventh time point t7 to the eighth time point t8 in FIG. 8. The execution period indicates a period in which the voltage applied to the selected word line WL is maintained at the program voltage Vpgm. For example, the execution period may indicate a time period from the third time point t3 to the fourth time point t4 in FIG. 7 and a time period from the eighth time point t8 to the ninth time point t9. The recovery period may indicate a period in which the voltage applied to the selected word line WL drops from the program voltage Vpgm to the first voltage V1. For example, the recovery period may indicate a time period from the fourth time point t4 to the fifth time point t5 in FIG. 7 and a time period from the ninth time point t8 and the tenth time point t10 in FIG. 8.

According to at least some example embodiments of the inventive concepts, the nonvolatile memory device 100 may adjust each period of a program pulse width according to a program operation to be performed. For example, the nonvolatile memory device 100 may adjust a rising period of a pulse width of a program voltage applied during the first program operation to be shorter than a rising period of a pulse width of a program voltage applied during the second program operation. The nonvolatile memory device 100 may adjust an execution period pulse width of a program voltage applied during the second program operation to be shorter than an execution period pulse width of a program voltage applied during the second program operation. The nonvolatile memory device 100 may adjust a recovery period of a pulse width of a program voltage applied during the first program operation to be shorter than a recovery period pulse width of a program voltage applied during the second program operation.

According to one or more of the above-described example embodiments of inventive concepts, the nonvolatile memory device 100 may program a plurality of page data into memory cells based on a multi-step program scheme. The nonvolatile memory device 100 (e.g., the control logic circuit 130) may adjust pulse width of a program voltage depending on a plurality of program operations included in the multi-step program scheme. According to at least some example embodiments of the inventive concepts, the nonvolatile memory device 100 (e.g., the control logic circuit 130) may further adjust program parameters such as a start level and an incremental of a program voltage and the number of program loops according to a program operation to be performed.

According to at least some example embodiments of the inventive concepts, each of a plurality of program operations included in a multi-step program scheme may include a plurality of program loops. The plurality of program operations may be classified based on various conditions. For example, the plurality of program operations may be classified depending on a digit of page data to be programmed (i.e., depending on whether the page data to be programmed is LSB page data, MSB page data, or CSB page data). Alternatively, the plurality of program operation may be classified depending on a level of an applied program voltage or a program start voltage. Alternatively, the plurality of program operation may be classified depending on a level of an applied verify voltage or the number of verify voltages. Alternatively, the plurality of program operations may be classified depending on an execution sequence at a single word line.

Figure 9:
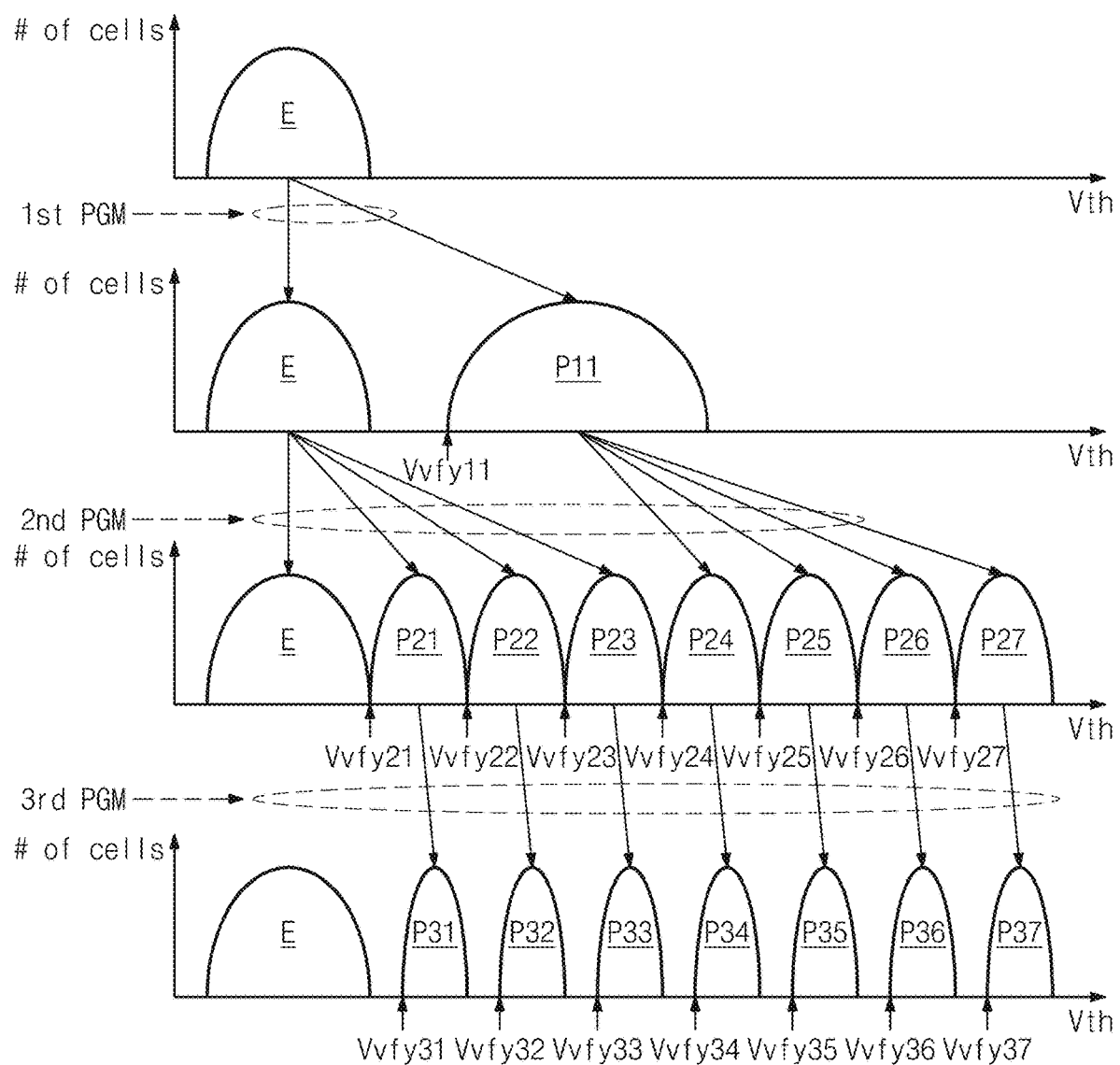
Figure 10:
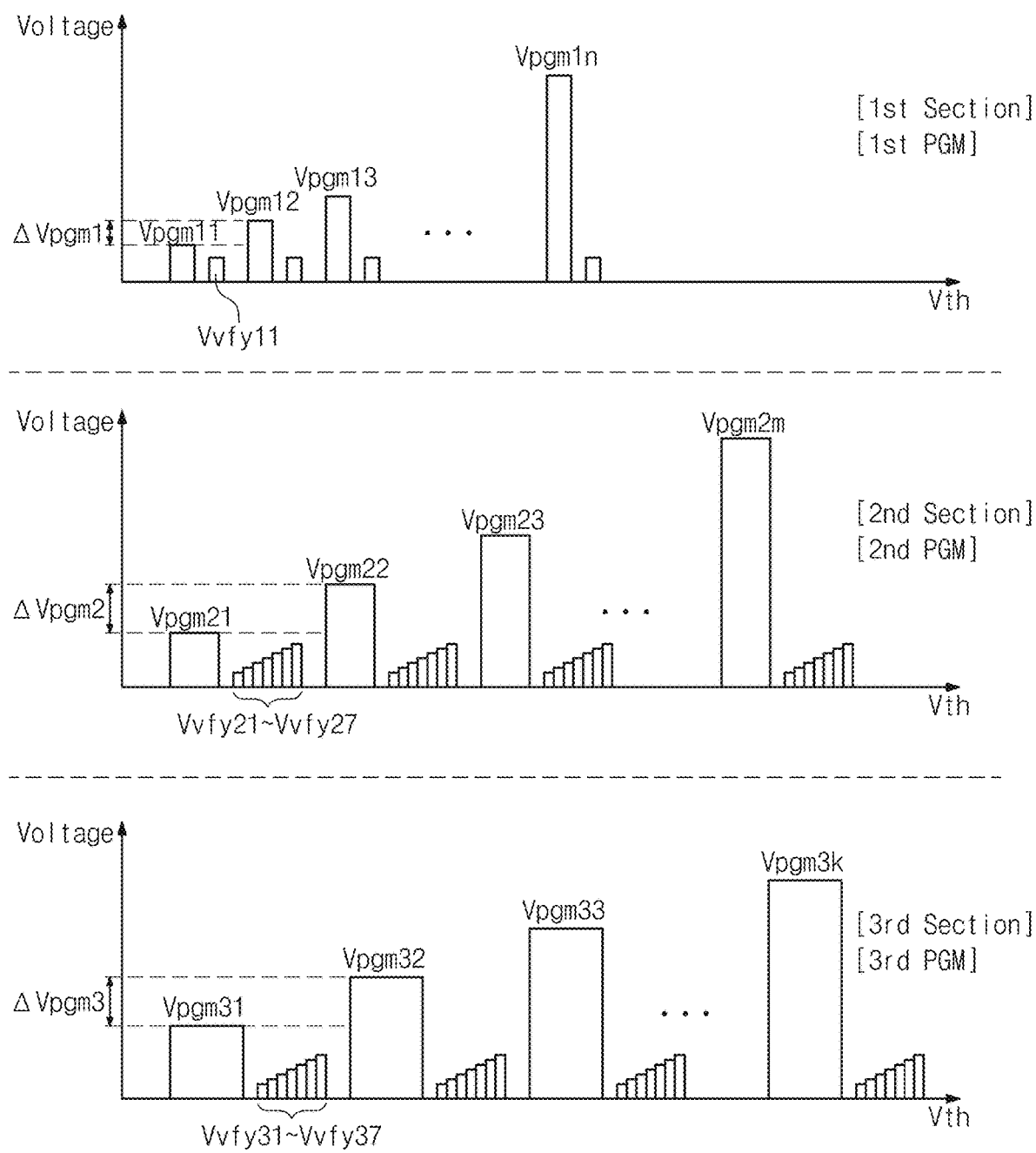

FIGS. 9 to 11 are drawings for describing the operation of a nonvolatile memory device according to at least some example embodiments of the inventive concepts. FIG. 9 is a drawing showing threshold voltage distribution of memory cells connected to a selected word line according to first to third program operation. FIG. 10 is a graph showing an applied voltage of a selected word line according to first to third program operations. FIG. 11 is a drawing showing the sequence of first to third program operations.

In order to describe the operation of a nonvolatile memory device 100 according to at least some example embodiments of inventive concepts, it will be assumed that each of selected memory cells is a triple-level cell (TLC) and the nonvolatile memory device 100 performs first to third program operations to program first to third page data into selected memory cells. However, at least some example embodiments of the inventive concepts are not limited thereto and the number of bits stored in respective memory cells and the number of program operations performed by the nonvolatile memory device 100 may be variously changed.

Referring to FIGS. 1, 9, and 10, the nonvolatile memory device 100 may perform a first program operation to program first page data into selected memory cells. For example, the nonvolatile memory device 100 may perform the first program operation such that the selected memory cells have one of an erase state E and a program state P11. As shown in a first section in FIG. 10, the first program operation may be performed based on the ISPP scheme. That is, the first program operation may include a plurality of program loops and each of the program loops includes a program step of applying program voltages Vpgm11 to Vpgm1n and a verify operation of applying a verify voltage Vvfy11. As the program loops are performed, the program voltages Vpgm11 to Vpgm1n increase sequentially by a first incremental of program voltage ΔVpgm1. At this point, the nonvolatile memory device (e.g., the control logic circuit 130) may adjust pulse widths of the program voltages Vpgm11 to Vpgm1n applied during the first program operation into first time T1.

After the first program operation is completed (i.e., after the first page data is programmed into the selected memory cells), the nonvolatile memory device 100 may perform a second program operation to program second data and third data into the selected memory cells (i.e., the memory cells into which the first page data is programmed). As shown in a second section in FIG. 10, the second program operation may be performed based on the ISPP scheme. That is, according to at least some example embodiments of the inventive concepts, the second program operation includes a plurality of program loops and each of the program loops includes a program step of applying program voltages Vpgm21 to Vpgm2m and a verify step of applying verify voltage Vvfy21 to Vvfy27. As the program loops are performed, the program voltages Vpgm21 to Vpgm2n increase sequentially by a second incremental of program voltage ΔVpgm2. At this point, the nonvolatile memory device 100 (e.g., the control logic circuit 130) may adjust pulse widths of the program voltages Vpgm21 to Vpgm2n applied during the second program operation into second time T2. According to at least some example embodiments of the inventive concepts, the second time T2 may be longer than the first time T1.

After the second program operation is completed (i.e., after the first to third page data are programmed into the selected memory cells), the nonvolatile memory device 100 may perform a third program operation. According to at least some example embodiments of the inventive concepts, the third program operation may be a reprogram operation. The third program operation may be a program operation that gathers threshold voltage dispersion corresponding to each program state to ensure a read margin. Similarly, as shown in a third section in FIG. 10, the third program operation may be performed based on the ISPP scheme. That is, the third program operation includes a plurality of program loops and each of the program loops includes a program step of applying program voltages Vpgm31 to Vpgm3n and a verify step of sequentially applying very voltages Vvfy31 to Vvfy37. As the program loops are performed, the program voltages Vpgm31 to Vpgm3m increase sequentially by a third incremental of program voltage ΔVpgm3. At this point, the nonvolatile memory device 100 may adjust pulse width of the program voltages Vpgm31 to Vpgm3k applied during the third program operation into third time T3. According to at least some example embodiments of the inventive concepts, the third time T3 may be longer than the first time T1.

Referring to FIGS. 1, 2, and 11, the nonvolatile memory device 100 may sequentially perform the first to third program operations described with reference to FIGS. 9 and 10 on memory cells connected to a selected word line.

For example, the nonvolatile memory device 100 may perform the first program operation on memory cells connected to a first word line WL1. (①) Then, the nonvolatile memory device 100 may perform the first program operation on memory cells connected to a second word line WL2. (②) Then, the nonvolatile memory device 100 may perform a second program operation on the memory cells connected to the first word line WL1 (i.e., the memory cells on which the first program operation was performed). (③) Then the nonvolatile memory device 100 may perform the first program operation on memory cells connected to a third word line WL3. (④) Then the nonvolatile memory device 100 may perform a third program operation on the memory cells connected to the first word line WL1 (i.e., the memory cells on which the second program operation was performed). (⑤) Then the nonvolatile memory device 100 may sequentially perform first to third program operations on memory cells connected to a plurality of word lines WL1 to WL6 according to the sequence shown in FIG. 11.

The above-described embodiments of inventive concepts are merely examples and at least some example embodiments of the inventive concepts are not limited thereto. For example, the nonvolatile memory device 100 may further adjust program parameters such a start level, increase, and pulse width of a program voltage and the number of program loops according to a program voltage to be performed. According to at least some example embodiments of the inventive concepts, the nonvolatile memory device 100 may increase pulse width of a program voltage as the program voltage increases. In addition, the nonvolatile memory device 100 may adjust a rising period, an execution period, and a recovery period of a program voltage.

According to at least some example embodiments of the inventive concepts, a multi-step program scheme to program a plurality of page data into memory cells connected to a single word line includes a plurality of program operations and the program operations may be classified based on various criteria. For example, the plurality of program operations may be classified based on target threshold voltage distribution. The plurality of program operations may be classified based on a level of an applied verify voltage. The plurality of program operations may be classified based on a digit of page data to be written.

Figure 12:
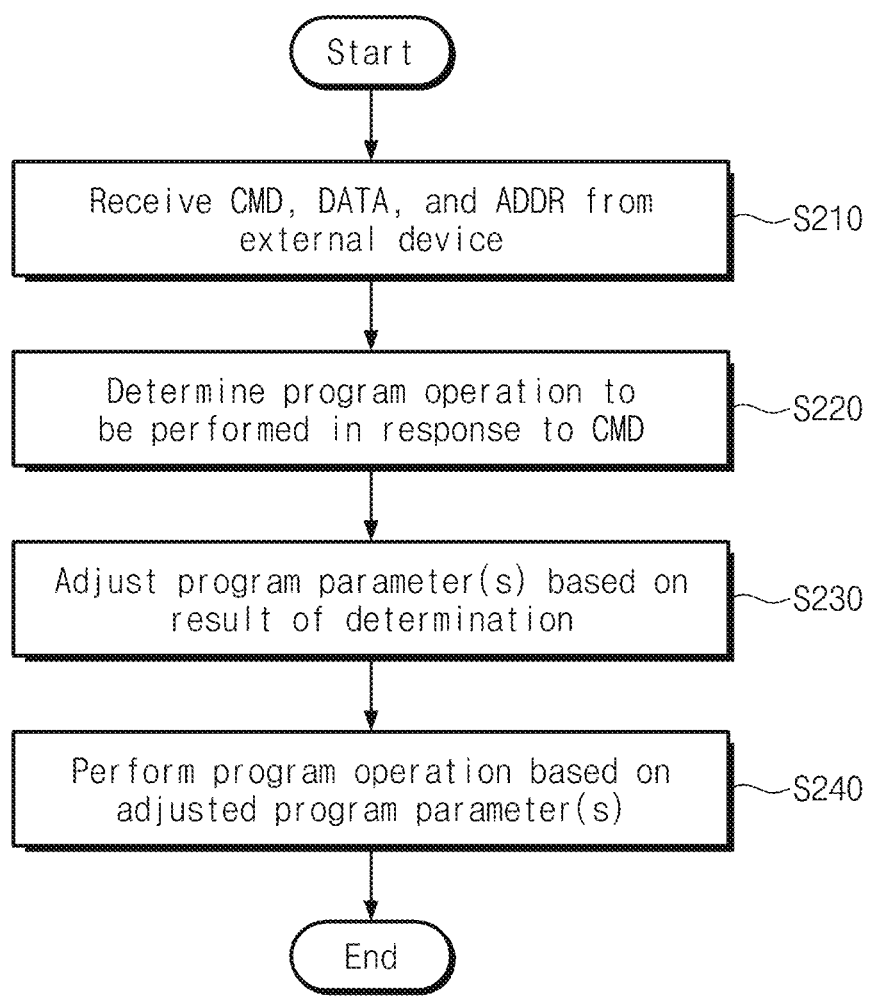
FIG. 12 is a flowchart summarizing the operation of a nonvolatile memory device according to at least some example embodiments of the inventive concepts.

FIG. 12 is a flowchart summarizing the operation of a nonvolatile memory device 100 according to at least some example embodiments of the inventive concepts. Referring to FIGS. 1 and 12, in an operation S210, the nonvolatile memory device 100 may receive a command CMD, an address ADDR, and data DATA from an external device. According to at least some example embodiments of the inventive concepts, the command CMD may be a signal defined by an interface between the nonvolatile memory device 100 and the external device. The address ADDR may be a physical address corresponding to a selected word line. The data DATA may include at least one page data.

In an operation S220, the nonvolatile memory device 100 may determine a program operation to be performed in response to the received command CMD. For example, as described with reference to FIGS. 1 to 11, the nonvolatile memory device 100 may program data DATA based on a multi-step program scheme including a plurality of program operations. The nonvolatile memory device 100 may determine a program operation to be performed, among the plurality of program operations, in response to the received command CMD.

According to at least some example embodiments of the inventive concepts, the nonvolatile memory device 100 may read a flag bit corresponding to the selected word line to perform the program operation to be performed. Alternatively, the nonvolatile memory device 100 may determine the program operation to be performed, based on the received command CMD.

According to at least some example embodiments of the inventive concepts, the nonvolatile memory device 100 may determine the operation to be performed, based on the number of program operations performed on memory cells connected to a selected word line. For example, as described with reference to FIG. 11, first to third program operations are sequentially performed on memory cells connected to a single word line (e.g., first word line WL1). That is, the nonvolatile memory device 100 may determine a program operation to be performed, based on the number of program operations performed previously.

According to at least some example embodiments of the inventive concepts, the nonvolatile memory device 100 may determine a program operation to be performed, according to a program state of memory cells connected to a selected word line. For example, as described with reference to FIG. 11, a second program operation is performed on a selected word line (e.g., first word line WL1) after a first program operation is performed on the selected word line. That is, when the first program operation performed on the selected word line is completed, memory cells connected to the selected word line may have an erase state E and a program state P11. That is, the nonvolatile memory device 100 may determine a program operation to be performed to be a second program operation when the selected memory cells have the erase state E and the program state P11.

In an operation S230, the nonvolatile memory device 100 may adjust a program parameter according to a result of the determination. For example, when the operation to be performed is determined to be the first program operation explained with reference to FIG. 9, the nonvolatile memory device 100 (e.g., the control logic circuit 130) may set the program parameter such that pulse width of a program voltage becomes first time T1. When the program operation to be performed is determined to be the second program operation described with reference to FIG. 9, the nonvolatile memory device 100 (e.g., the control logic circuit 130) may set the program parameter such that the pulse width of the program voltage becomes second time T2.

According to at least one example embodiment of the inventive concepts, the nonvolatile memory device 100 may adjust not only the pulse width of the program voltage but also parameters such as a start level and a magnitude of the increment of the ISPP program voltages and the number of program loops.

In an operation S240, the nonvolatile memory device 100 may perform a program operation based on the adjusted program parameter.

According one or more of the above-described example embodiments of inventive concepts, a nonvolatile memory device 100 (e.g., the control logic circuit 130) configured to program data based on a multi-step program scheme adjusts a pulse width, increment magnitude, and a start level of a program voltage and the number of program loops according to a program operation to be performed and performs the program operation based on the adjusted program parameter. Thus, since program execution time is reduced according to the program operation, a nonvolatile memory device with improved performance is provided.

Figure 13:
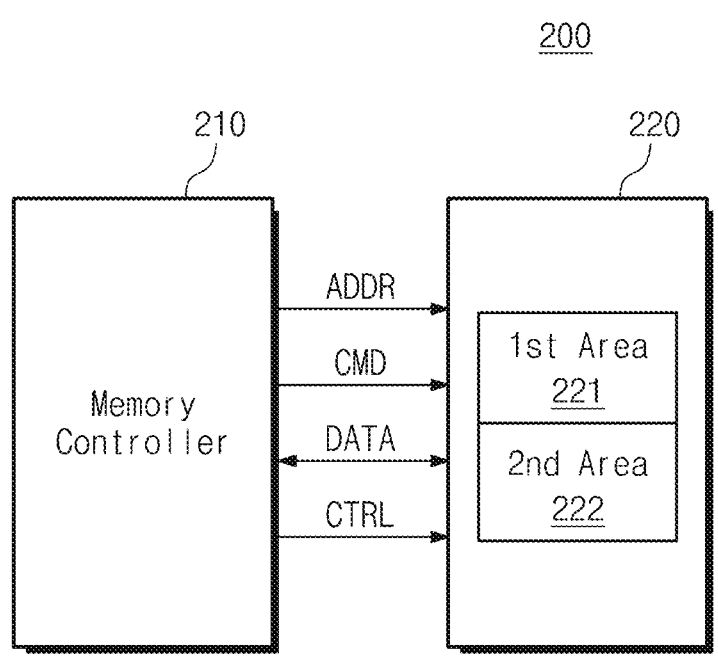
FIG. 13 is a block diagram of a nonvolatile memory system according to at least some example embodiments of the inventive concepts.
Figure 14:
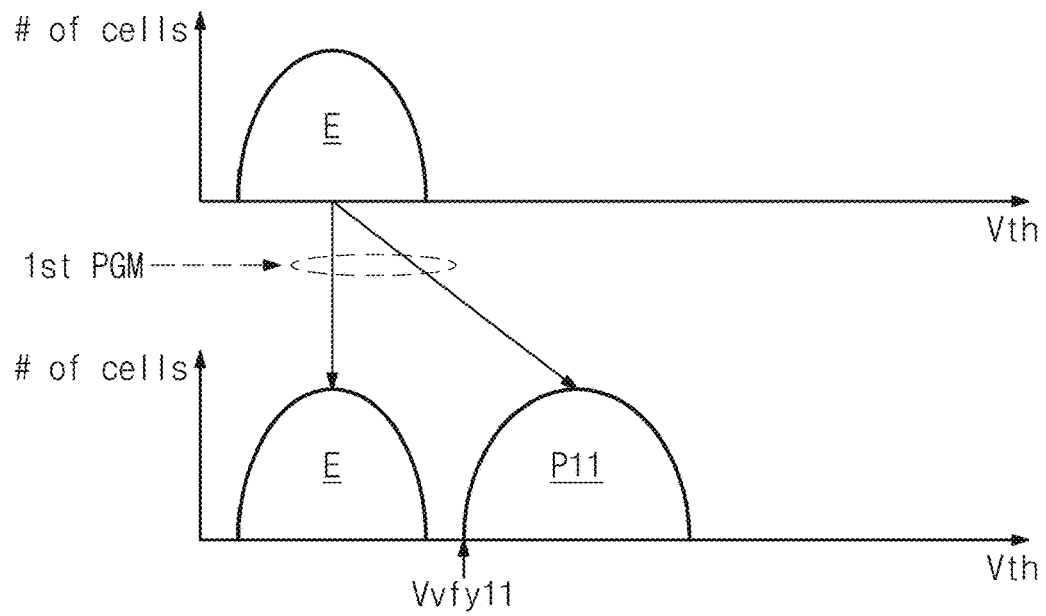
FIGS. 14 and 15 are drawings for describing a program operation of a nonvolatile memory device in FIG. 13.
Figure 15:
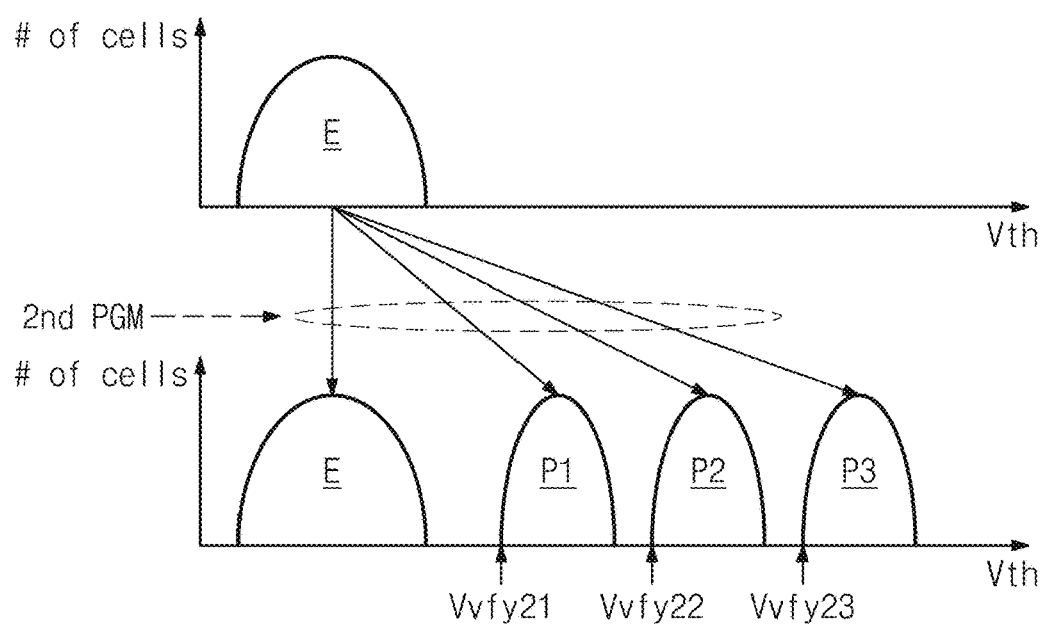

FIG. 13 is a block diagram of a nonvolatile memory system 200 according to at least some example embodiments of the inventive concepts. FIGS. 14 and 15 are drawings for describing a program operation of the nonvolatile memory device 200 in FIG. 13.

As illustrated in FIGS. 13 to 15, the nonvolatile memory system 200 includes a memory controller 210 and a nonvolatile memory device 220. The memory controller 210 may write data DATA into the nonvolatile memory device 220 or read data DATA written into the nonvolatile memory device 220. For example, the memory controller 210 may transmit a command CMD, an address ADDR, and a control signal CTRL to the nonvolatile memory device 220 to write the data DATA into the nonvolatile memory device 220 or to read the data written into the nonvolatile memory device 220.

The nonvolatile memory device 220 may store data DATA received from the memory controller 220 or transmit stored data DATA to the memory controller according to the control of the memory controller 210.

According to at least some example embodiments of the inventive concepts, the nonvolatile memory device 220 may include a first storage area 221 and a second storage area 222. Each of a plurality of memory cells included in the first storage area 221 may include a single-level cell (SLC), and each of a plurality of memory cells included in the second storage area 222 may include a multi-level cell (MLC).

According to at least some example embodiments of the inventive concepts, the nonvolatile memory device 220 may perform a first program operation such as shown in FIG. 14 to write data DATA into the first storage area 221. For example, the nonvolatile memory device 220 may perform a first program operation such that selected memory cells in the first storage area 221 have one of an erase state E and a program state P11.

According to at least some example embodiments of the inventive concepts, the nonvolatile memory device 220 may perform a second program operation such as shown in FIG. 15 to write data DATA into the second storage area 222. For example, the nonvolatile memory device 220 may perform the second program operation such that selected memory cells in the second storage area 222 have one of an erase state E and program states P1 to P3.

According to at least some example embodiments of the inventive concepts, the first program operation in FIG. 14 may be similar to or, alternatively, the same as the first program operation shown in the first section in FIG. 5. The second program operation in FIG. 15 may be similar to or, alternatively, the same as the second program operation shown in the second section in FIG. 5.

As described above, the nonvolatile memory device 220 may perform different program operations according to a storage area of the nonvolatile memory device 220. In this case, the nonvolatile memory device 220 may adjust pulse width of a program voltage according to a program operation to be performed, as described with reference to FIGS. 1 to 12. Thus, a nonvolatile memory system with improved performance is provided.

According to at least some of the example embodiments of inventive concepts described with reference to FIGS. 1 to 15, a nonvolatile memory device may adjust pulse width of a program voltage (or a start level and incremental of the program voltage and the number of program loops) according to a program operation to be performed. According to at least some example embodiments of the inventive concepts, the higher a program start voltage of a program operation to be performed, the wider pulse width of the program voltage. The higher a level of a minimum or maximum verify voltage of the program operation to be performed, the wider pulse width of the program voltage. According to at least some example embodiments of the inventive concepts, the nonvolatile memory device (e.g., the control logic circuit 130) may adjust a rising period, an execution period, and a recovery period of a program voltage to adjust pulse width of the program voltage.

Figure 16:
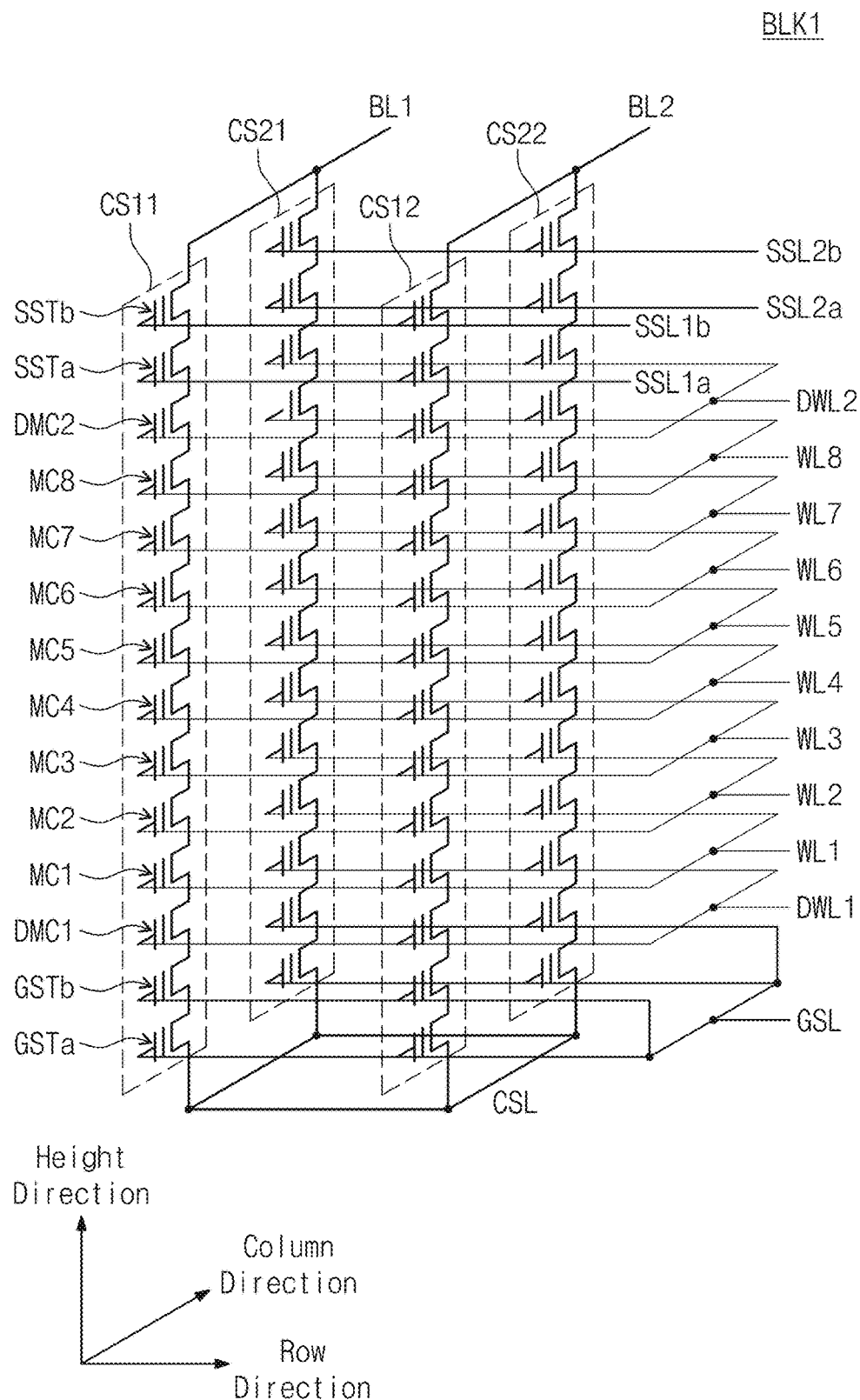
FIG. 16 is a circuit diagram illustrating another example of a first memory block included in a nonvolatile memory device according to at least some example embodiments of the inventive concepts.

FIG. 16 is a circuit diagram illustrating another example of a first memory block included in a nonvolatile memory device according to at least some example embodiments of the inventive concepts. According to at least some example embodiments of the inventive concepts, a first memory block BLK1 of a three-dimensional structure will be described with reference to FIG. 16. However, at least some example embodiments of the inventive concepts are not limited thereto and other memory blocks may have a similar structure to the first memory block BLK1.

As illustrated in FIG. 16, the first memory block BLK1 includes a plurality of cell strings CS11, CS12, CS21, and CS22. The cell strings CS11, CS12, CS21, and CS22 may be arranged in a row direction and a column direction to form rows and columns.

For example, the cell strings CS11 and CS12 may be connected to string selection lines SSL1 and SSL1b to form a first row. The cell strings CS21 and CS22 may be connected to string selection lines SSL2a and SSL2b to form a second row.

For example, the cell strings CS11 and CS21 may be connected to a first bitline BL1 to form a first column. The cell strings CS12 and CS22 may be connected to a second bitline BL2 to form a second column.

Each of the cell strings CS11, CS12, CS21, and CS22 includes a plurality of cell transistors. For example, each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2.

According to at least some example embodiments of the inventive concepts, each of a plurality of cell transistors included in the cell strings CS11, CS12, CS21, and CS22 may be a charge trap flash (CTF) memory cell.

The memory cells MC1 to MC8 are connected in series and are stacked in a height direction perpendicular to a substrate formed by a row direction and a column direction. The string selection transistors SSTa and SSTb are connected in series. The serially connected string selection transistors SSTa and SSTb are provided between the memory cells MC1 to MC8 and a bitline BL. The ground selection transistors GSTa and GSTb are connected in series. The serially connected ground selection transistors GSTa and GSTb are provided between the memory cells MC1 to MC8 and a common source line CSL.

According to at least some example embodiments of the inventive concepts, a first dummy memory cell DMC1 may be provided between the memory cells MC1 to MC8 and the ground selection transistors GSTa and GSTb. According to at least some example embodiments of the inventive concepts, a second dummy memory cell MC2 may be provided between the memory cells MC1 to MC8 and the string selection transistors SSTa and SSTb.

The ground selection transistors GSTa and GSTb of the cell strings CS11, CS12, CS21, and CS22 may be commonly connected to a ground selection line GSL.

According to at least some example embodiments of the inventive concepts, ground selection transistors of the same row may be connected to the same ground selection line and ground selection transistors of a different row may be connected to a different selection line. For example, the first ground selection transistor GSTa of the cell strings CS11 and CS12 of a first row may be connected to a first ground selection line and the first ground selection transistor GSTa of the cell strings CS21 and CS22 of a second row may be connected to a second ground selection line.

According to at least some example embodiments of the inventive concepts, although not shown in the drawing, ground selection transistors provided at the same height from a substrate (not shown) may be connected to the same ground selection line and ground selection transistors provided at different heights from the substrate may be connected to different ground selection lines. For example, first ground selection transistors GSTa of the cell strings CS11, CS12, CS21, and CS22 may be connected to a first ground selection line and second ground selection transistors GSTb of the cell strings CS11, CS12, CS21, and CS22 may be connected to a second ground selection line.

Memory cells of the same height from a substrate (or the ground selection transistors GSTa and GSTb) are commonly connected to the same word line, and memory cells of different heights from the substrate (or the ground selection transistors GSTa and GSTb) are connected to different word lines. For example, first to eighth memory cells MC1 to MC8 of the cells strings CS11, CS12, CS21, and CS22 are commonly connected to first to eighth word lines WL1 to WL8, respectively.

Among the first string selection transistors SSTa of the same height, string selection transistors of the same row are connected to the same string selection line and string selection transistors of different rows are connected to different string selection lines. For example, the first string selection transistors SSTa of the cell strings CS11 and CS12 of the first row are commonly connected to a string selection line SSL1a and the first string selection transistors SSTa of the cell strings CS21 and CS22 of the second row are connected to the string selection line SSL1a.

Similarly, among the second selection transistors SSTb of the same height, string selection transistors of the same height are connected to the same string selection line and string selection transistors of different rows are connected to different string selection lines. For example, the string selection transistors SSTb of the cell strings CS11 and CS12 of the first row are commonly connected to a string selection line SSL1b and the string selection transistors SSTb of the cell strings CS21 and CS22 of the second row are commonly connected to the string selection line SSL2b.

Although not shown in the drawing, string selection transistors of cell strings of the same row may be commonly connected to the same string selection line. For example, the first and second string selection transistors SSTa and SSTb of the cell strings CS11 and CS12 of the first row may be commonly connected to the same string selection line. The first and second string selection transistors SSTa and SSTb of the cell strings CS21 and CS22 of the second row may be commonly connected to the same string selection line.

According to at least some example embodiments of the inventive concepts, dummy memory cells of the same height are connected to the same dummy word line and dummy memory cells of different heights are connected to different dummy word lines. For example, the first dummy memory cells DMC1 are connected to a first dummy word line DWL1 and second dummy memory cells DMC2 are connected to a second dummy word line DWL2.

In the first memory block BLK1, read and write operations may be performed in units of rows. For example, a single row of a memory block BLKa may be selected by the string selection lines SSL1a, SSL1b, SSL2a, and SSL2b.

For example, when the string selection lines SSL1a and SSL1b are supplied with a turn-on voltage and the string selection lines SSL2a and SSL2b are supplied with a turn-off voltage, the cell strings CS11 and CS12 of the first row are connected to the bitlines BL1 and BL2. When the string selection lines SSL2a and SSL2b are supplied with a turn-on voltage and the string selection lines SSL1a SSL1b are supplied with a turn-off voltage, the cell strings CS21 and CS22 of the second row are connected to the bitlines BL1 and BL2 to be driven. Among memory cells of a cell string of a row driven by driving a word line, memory cells of the same height are selected. Read and write operation may be performed on the selected memory cells. The selected memory cells may form a physical page unit.

In the first memory block BLK1, an erase operation may be performed in units of memory blocks or sub-blocks. When an erase operation is performed in units of memory blocks, all memory cells MC of the first memory block BLK1 may be simultaneously erased according to a single erase request. When an erase operation is performed in units of sub-blocks, some of memory cells MC of the first memory block BLK1 may be simultaneously erased according to a single erase request and the other memory cells may be erase-inhibited. A word line connected to the erased memory cells may be supplied with a low voltage (e.g., ground voltage), and a word line connected to the erase-inhibited memory cells may be floated.

According to at least some example embodiments of the inventive concepts, the first memory block BLK1 shown in FIG. 4 is merely an example, the number of cell strings may increase or decrease, and the number of rows and columns constituted by cell strings may increase or decrease according to the number of the cell strings. Moreover, the number of cell transistors GSTS, MC, DMC, SST, and the like of the first memory block BLK1 may increase or decrease, and height of the first memory block BLK1 may increase or decrease according to the number of the cell transistors. The number of lines GSL, WL, DWL, SSL, and the like connected to the cell transistors may increase or decrease according to the number of the cell transistors.

According to at least some example embodiments of the inventive concepts, a nonvolatile memory device may program data into the first memory block BLK1 shown in FIG. 16 based on a multi-step program scheme. In this case, the nonvolatile memory device (e.g., the control logic circuit 130) may adjust pulse width of an applied program voltage according to a program operation to be performed, as described with reference to FIGS. 1 to 15.

Figure 17:
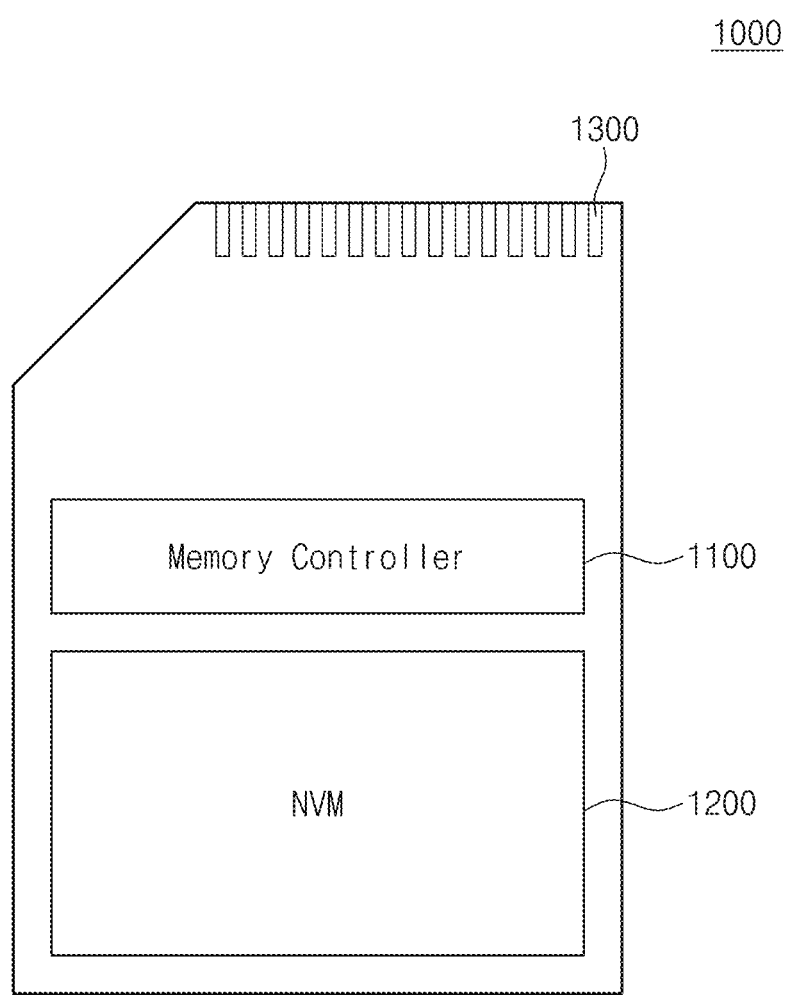
FIG. 17 is a block diagram of a memory card system to which a nonvolatile memory system according to at least some example embodiments of the inventive concepts is applied.

FIG. 17 is a block diagram of a memory card system 1000 to which a nonvolatile memory system according to at least some example embodiments of the inventive concepts is applied. As illustrated, the memory card system 1000 includes a controller 1100, a nonvolatile memory 1200, and a connector 1300.

The controller 1100 is connected to a nonvolatile memory 1200. The controller 1100 is configured to access the nonvolatile memory 1200. For example, the controller 1100 is configured to control read, write, erase, and background operations of the nonvolatile memory 1200. According to at least some example embodiments of the inventive concepts, the controller 1100 may be embodied by one or more processors. The background operation includes operations such as wear-level management and garbage collection.

The controller 1100 is configured to provide interfacing between the nonvolatile memory 1200 and a host. The controller 1100 is configured to drive firmware for controlling the nonvolatile memory device 1200.

According to at least some example embodiments of the inventive concepts, the controller 1100 may include elements such as a random access memory (RAM), a processing unit, a host interface, a memory interface, and an error correction unit.

The controller 1100 may communicate with an external device via the connector 1300. The controller 1100 may communicate with an external device (e.g., host) via at least one of various communications standards such as USB (Universal Serial Bus), MMC (multimedia card), PCI (peripheral component interconnection), PCI-E (PCI-express), ATA (Advanced Technology Attachment), Serial-ATA, Parallel-ATA, SCSI (small computer small interface), ESDI (enhanced small disk interface), IDE (Integrated Drive Electronics), Firewire, UFS (Universal Flash Storage), and NVMe (Nonvolatile Memory express).

The nonvolatile memory 1200 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The controller 1100 and the nonvolatile memory device 1200 may be integrated into a single semiconductor device. According to at least some example embodiments of the inventive concepts, the controller 1100 and the non-volatile memory device 1200 may be integrated into a single semiconductor device to constitute a solid state drive (SSD). The controller 1100 and the non-volatile memory device 1200 may be integrated into a single semiconductor device to constitute a memory card. For example, The controller 1100 and the non-volatile memory device 1200 may be integrated into a single semiconductor device to constitute a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The nonvolatile memory device 1200 or the memory system 1000 may be mounted in various types of packages. For example, the nonvolatile memory device 1200 or the memory system 1000 may be packaged by one of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline (SOIC), a shrink small outline package (SSOP), a thin small outline package (TSOP), a system in package (SIP), a multi-chip package (MCP), a wafer-level fabricated package (WFP), and a wafer-level processed stack package (WSP).

According to at least some example embodiments of the inventive concepts, the nonvolatile memory 1200 may operate based on the program method described with reference to FIGS. 1 to 15.

Figure 18:
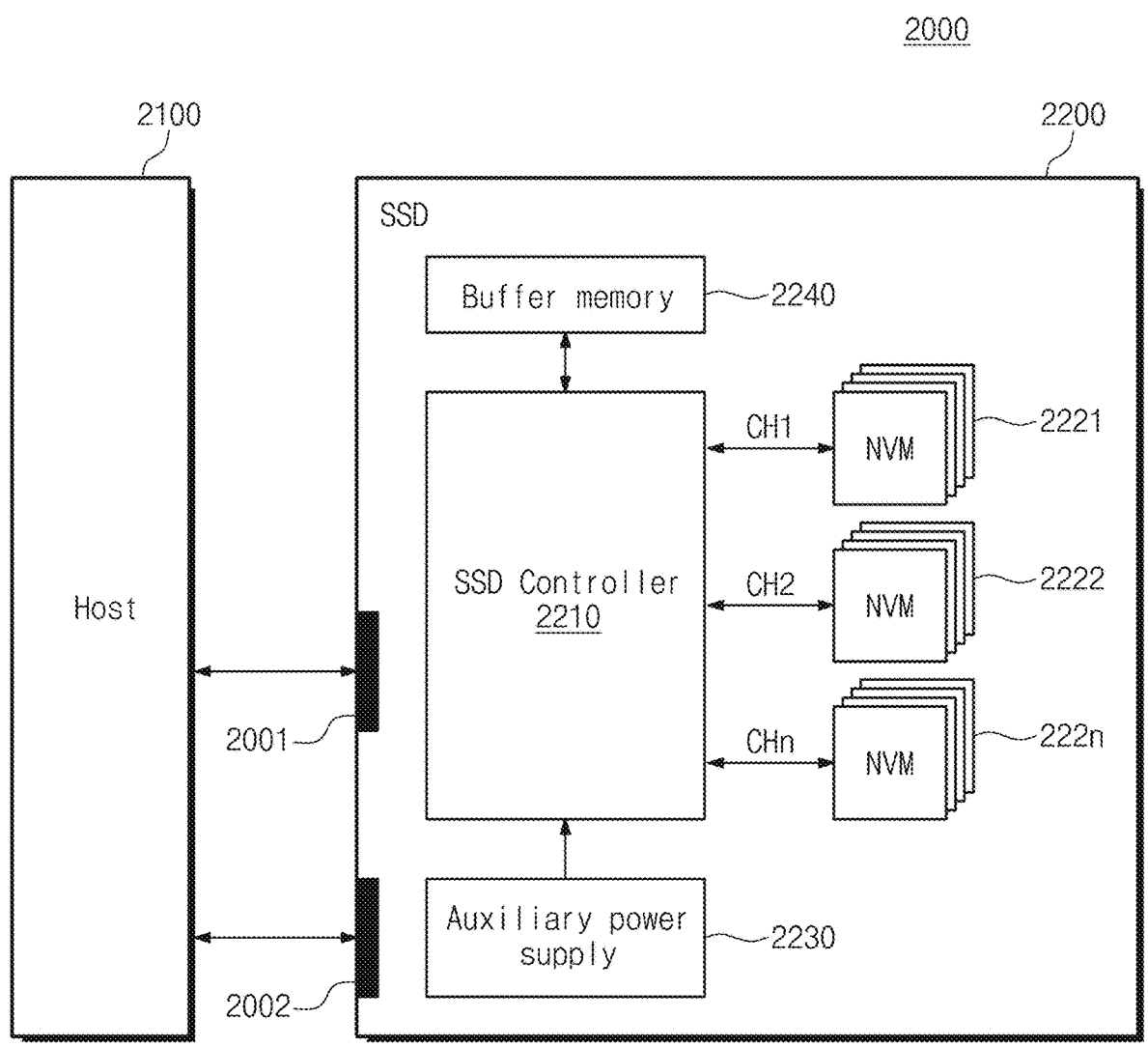
FIG. 18 is a block diagram of a solid state drive (SSD) system to which a nonvolatile memory system according to at least some example embodiments of the inventive concepts is applied.

FIG. 18 is a block diagram of a solid state drive (SSD) system to which a nonvolatile memory system according to at least some example embodiments of the inventive concepts is applied. As illustrated, the SSD system 2000 includes a host 2100 and an SSD 2200. The SSD 2200 transmits/receives a signal SIG to/from a host 2100 and receives power PWR via a power connector 2002. The SSD 2200 includes an SSD controller 2210, a plurality of flash memories 2221 to 222n, an auxiliary power supply 2230, and a buffer memory 2240.

The SSD controller 2210 may control the flash memories 2221 to 222n in response to the signal SIG received from the host 2100. The flash memories 2221 to 222n may perform a program operation according to the control of the SSD controller 2210. According to at least some example embodiments of the inventive concepts, the flash memories 2221 to 222n may perform a program operation based on the program method described with reference to FIGS. 1 to 15.

The auxiliary power supply 2230 is connected to the host 2100 via the power connector 2002. The auxiliary power supply 2230 may receive the power PWR from the host 2100 to be charged. The auxiliary power supply 2230 may supply power of the SSD system 2000 when power is not sufficiently supplied from the host 2100. According to at least some example embodiments of the inventive concepts, the auxiliary power supply 2230 may be disposed inside or outside the SSD 2200. For example, the auxiliary power supply 2230 may be disposed at a main board and may supply auxiliary power to the SSD 2200.

The buffer memory 2240 operates as a buffer memory of the SSD 2200. For example, the buffer memory 2240 may temporarily store data received from the host 2100 or data received from the flash memories 2221 to 222n or may temporarily store meta data (e.g., mapping table) of the flash memories 2221 to 222n. The buffer memory 2240 may include a nonvolatile memory such as DRAM, SDRAM, DDR SDRAM, LPDDR SDRAM, and SRAM or a nonvolatile memory such as FRAM ReRAM, STT-MRAM, and PRAM.

Figure 19:
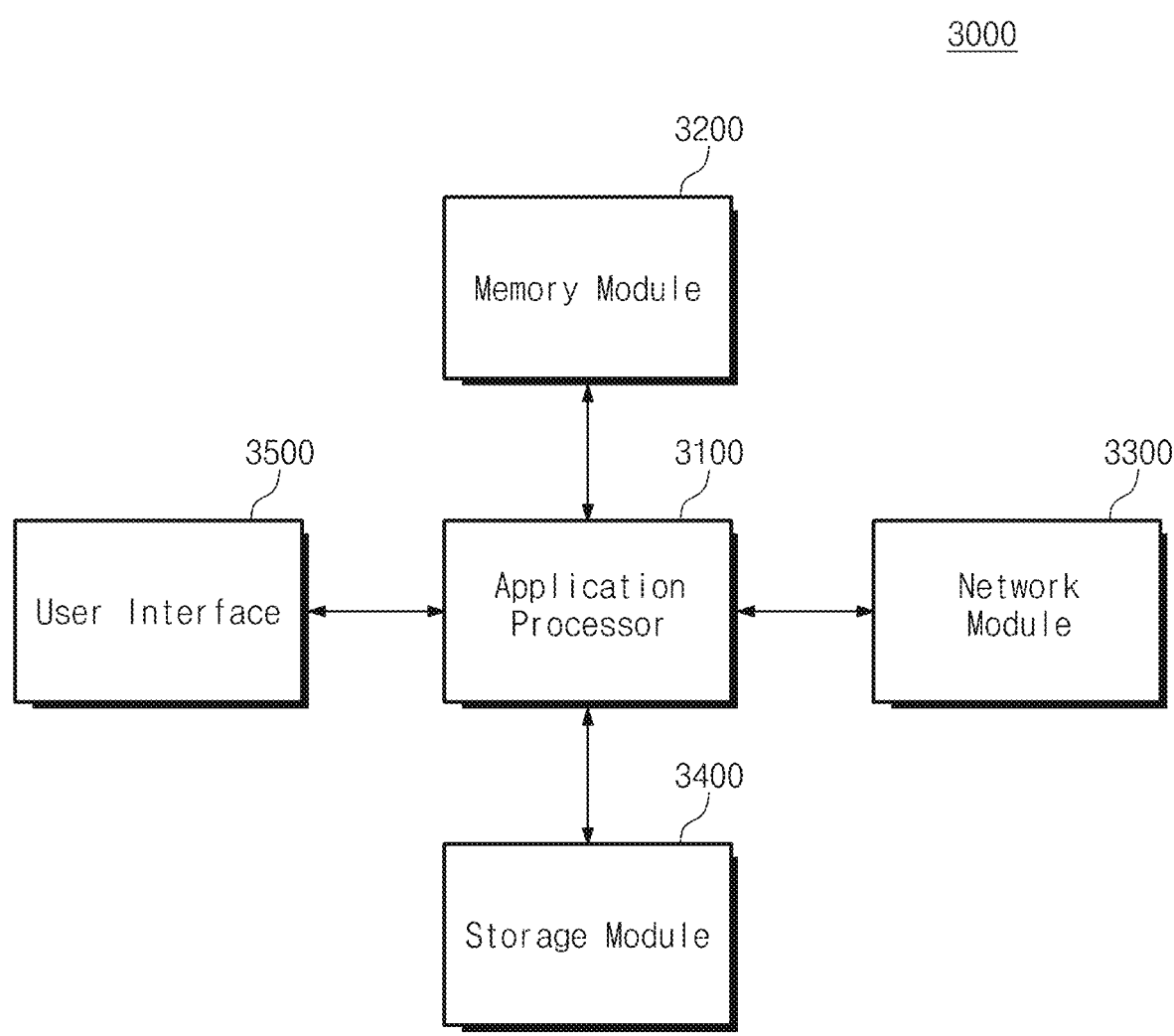
FIG. 19 is a block diagram of a user system to which a nonvolatile memory system according to at least some example embodiments of the inventive concepts is applied.

FIG. 19 is a block diagram of a user system 3000 to which a nonvolatile memory system according to at least some example embodiments of the inventive concepts is applied. As illustrated, the user system 3000 includes an application processor 3100, a memory module 3200, a network module 3300, a storage module 3400, and a user interface 3500.

The application processor 3100 may drive components incorporated in the user system 3000 and operating system (OS). According to at least some example embodiments of the inventive concepts, the application processor 3100 may include controllers to control components incorporated in the user system 3000, interfaces, a graphic engine, and the like. The application processor 3100 may be provided as a system-on-chip (SoC).

The memory module 3200 may operate as a main memory, a working memory, a buffer memory or a cache memory of the user system 3000. The memory module 3200 may include a volatile random access memory such as DRAM, SDRAM, DDR SDRAM, DDR2 SDRAM, DDR3 SDRAM, LPDDR DRAM, LPDDR2 DRAM, LPDDR3, and DRAM and a nonvolatile random access memory such as PRAM, ReRAM, MRAM, and FRAM. According to at least some example embodiments of the inventive concepts, the memory module 3200 and the application processor 3100 may be implemented based on package on package (POP).

The network module 3300 may communicate with external devices. According to at least some example embodiments of the inventive concepts, the network module 3300 may support wireless communication such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, and WI-DI. According to at least some example embodiments of the inventive concepts, the network module 3300 may be included in the application processor 3100.

The storage module 3400 may store data. For example, the storage module 3400 may store data received from the application processor 3100. Alternatively, the storage module 3400 may transmit its stored data to the application processor 3100. According to at least some example embodiments of the inventive concepts, the storage module 3400 may be implemented using a semiconductor memory device such as a phase-change RAM (PRAM), a magnetic RAM (MRAM), a resistive RAM (RRAM), a NAND flash memory, a NOR flash memory, a three-dimensional NAND flash memory. In example embodiment, the storage module 3400 may include a plurality of nonvolatile memory devices. The nonvolatile memory devices of the storage module 3400 may operate based on the program method described with reference to FIGS. 1 to 15.

The user interface 3500 may interfaces to input data or a command to the application processor 3100 or output data to an external device. For example, the user interface device 3500 may include user input interfaces such as a keyboard, a keypad, a button, a touch panel, a touch screen, a touch ball, a touch pad, a camera, a gyroscope sensor, and a vibration sensor. The user interface device 3500 may include user output interfaces such as an liquid crystal display (LCD), an organic light emitting diode (OLED) display, an active matrix OLED (AMOLED) display, LED, a speaker, and a motor.

According to one or more of the above-described example embodiments of inventive concepts, a nonvolatile memory device may program a plurality of page data into memory cells connected to a selected word line based on a multi-step program scheme including a plurality of program operations. In this case, the nonvolatile memory device may sequentially perform the plurality of program operations on selected memory cells and adjust pulse width of an applied program voltage according to a program operation to be performed. Thus, since execution time of the program operation is reduced, a nonvolatile memory device with improved performance is provided.

The above-disclosed subject matter is to be considered illustrative, and not restrictive, and the appended claims are intended to cover all such modifications, enhancements, and other features, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description. While some example embodiments have been particularly shown and described, it will be understood by one of ordinary skill in the art that variations in form and detail may be made therein without departing from the spirit and scope of the claims. Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of programming a nonvolatile memory including a plurality of memory cells, the method comprising:
  performing a first program operation on selected memory cells, which are connected with a first selected word line, of the plurality of memory cells, the first program operation including a plurality of first program loops using first program voltages; and
  performing a second program operation on the selected memory cells without an erase operation, the second program operation including a plurality of second program loops using second program voltages,
  wherein:

first pulse widths of at least three of the first program voltages are different from second pulse widths of at least three of the second program voltages, respectively, the at least three of the first program voltages are used in at least three first program loops of the plurality of first program loops from a time point when the first program operation starts, and the at least three of the second program voltages are used in at least three second program loops of the plurality of second program loops from a time point when the second program operation starts, and the first pulse widths and the second pulse widths indicate first and second pulse durations, respectively.

2. The method of claim 1, wherein each of the second pulse widths is wider than each of the first pulse widths.

3. The method of claim 1,
wherein each of the first program voltages is increased by a first increment as each of the plurality of first program loops is sequentially performed, and
wherein each of the second program voltages is increased by a second increment as each of the plurality of second program loops is sequentially performed.

4. The method of claim 1,
wherein the first program operation comprises a program operation for programming at least one bit in each of the selected memory cells, and
wherein the second program operation comprises a program operation for programming at least two bits in the each of the selected memory cells without the erase operation.

5. The method of claim 4, wherein after the second operation is performed, each of the selected memory cells stores at least three bits.

6. The method of claim 1,
wherein each of the first program loops comprises:
supplying a corresponding one of the first program voltages to the first selected word line; and
supplying first verifying voltages to the first selected word line, wherein each of the second program loops comprises:
supplying a corresponding one of the second program voltages to the first selected word line; and
supplying second verifying voltages to the first selected word line, and
wherein a number of the first verifying voltages is smaller than a number of the second verifying voltages.

7. The method of claim 1, wherein each of the first program loops comprises:
increasing a voltage of the first selected word line from a first voltage to a pass voltage to maintain the voltage of the first selected word line at the pass voltage during a first time period;
increasing the voltage of the first selected word line from the pass voltage to corresponding one of the first program voltages to maintain the voltage of the first selected word line at the corresponding one of the first program voltages during a second time period; and
decreasing the voltage of the first selected word line from the corresponding one of the first program voltages to the first voltage after the second time period.

8. The method of claim 7, wherein each of the second program loops further comprises:
increasing a voltage of each of string selection lines, unselected word lines, and ground selection lines from the first voltage to the pass voltage to maintain the voltage of the each of the string selection lines, the unselected word lines, and the ground selection lines at the pass voltage until the second time period; and
decreasing the voltage of the each of the string selection lines, the unselected word lines, and the ground selection lines from the pass voltage to the first voltage after the second time period,
wherein the string selection lines, the unselected word lines, and the ground selection lines are connected with a selected memory block including the selected memory cells.

9. The method of claim 7, wherein each of the second program loops comprises:
increasing the voltage of the first selected word line from the first voltage to the pass voltage to maintain the voltage of the first selected word line at the pass voltage during a third time period;
increasing the voltage the first selected word line from the pass voltage to one of the second program voltages to maintain the voltage of the first selected word line at the one of the second program voltages during a fourth time period; and
decreasing the voltage of the first selected word line from the one of the second program voltages to the first voltage after the fourth time period.

10. The method of claim 9, wherein each of the second program loops further comprises:
increasing a voltage of each of string selection lines, unselected word lines, and ground selection lines from the first voltage to the pass voltage to maintain the voltage of the each of the string selection lines, the unselected word lines, and the ground selection lines at the pass voltage until the fourth time period; and
decreasing the voltage of the each of the string selection lines, the unselected word lines, and the ground selection lines from the pass voltage to the first voltage after the fourth time period,
wherein the string selection lines, the unselected word lines, and the ground selection lines are connected with a selected memory block including the selected memory cells.

11. The method of claim 9, wherein the fourth time period is longer than the second time period.

12. The method of claim 1, further comprising:
performing a third program operation on other memory cells connected with a second word line, the third program operation including a plurality of third program loops using the first program voltages,
wherein the third program operation is performed after performing the first program operation and before performing the second program operation.

13. The method of claim 1, further comprising:
performing a third program operation on the selected memory cells without the erase operation, the third program operation including a plurality of third program loops using third program voltages,
wherein third pulse widths of the third program voltages are different from the first pulse widths of the first program voltages and the second pulse widths of the second program voltages, respectively.

14. The method of claim 1, wherein each of the first pulse widths of at least three of the first program voltages comprises:
a first rising period in which a voltage of the first selected word line rises from a first voltage to one of the first program voltages;

a first execution period in which the voltage of the first selected word line is maintained at the one of the first program voltages; and a first recovery period in which the voltage of the first selected word line falls from the one of the first program voltages to the first voltage, and wherein each of the pulse widths of at least three of the second program voltages comprises:

a second rising period in which a voltage of the first selected word line rises from a first voltage to one of the second program voltages;

a second execution period in which the voltage of the first selected word line is maintained at the one of the second program voltages; and a second recovery period in which the voltage of the first selected word line falls from the one of the second program voltages to the first voltage.

15. The method of claim 14, wherein the first rising period is shorter than the second rising period, the first execution period is shorter than the second execution period, or the first recovery period is shorter than the second recovery period.

16. A method of programming a nonvolatile memory device including a plurality of memory cells, the method comprising:

performing a first program operation on selected memory cells performing a first program operation on selected memory cells by sequentially supplying first program voltages to a selected word line connected to the selected memory cells; and performing a second program operation on the selected memory cells by sequentially supplying second program voltages to the selected word line without an erase operation, and wherein:

a pulse width of each of the first program voltages is different from a pulse width of each of the second program voltages, a number of the first program voltages is greater than or equal to three, and a number of the second program voltages is greater than or equal to three, and the pulse widths of the first program voltages and the pulse widths of the second program voltages indicate first and second pulse durations, respectively.

17. The method of claim 16, wherein the pulse width of each of the second program voltages is wider than the pulse width of each of the first program voltages.

18. The method of claim 16, further comprising:

receiving a first command from an external controller before performing the first program operation; and receiving a second command from the external controller before perform the second program operation, wherein:

the first program operation is performed in response to the first command, and the second program operation is performed in response to the second command.

19. The method of claim 16, wherein:

the first program operation comprises a program operation for programming at least one bit in each of the selected memory cells, and the second program operation comprises a program operation for programming at least two bits in the each of the selected memory cells without the erase operation.

20. A method of programming a nonvolatile memory including a plurality of memory cells, the method comprising:

receiving at least one page data;

performing a first program operation on selected memory cells of the plurality of memory cells to program the at least one page data at the selected memory cells;

receiving at least two page data; and performing a second program operation on the selected memory cells to program the at least two page data at the selected memory cells without an erase operation, wherein the first program operation includes a plurality of first program loops using first program voltages, wherein the second program operation includes a plurality of second program loops using second program voltages, and wherein a pulse width of each of the first program voltages is different from a pulse width of each of the first program voltages, and the pulse widths of the first program voltages and the pulse widths of the second program voltages indicate first and second pulse durations, respectively.

* * * * *